(12) United States Patent
Tsai et al.

(10) Patent No.: US 12,382,694 B2
(45) Date of Patent: Aug. 5, 2025

(54) RADICAL ETCHING IN GATE FORMATION

(71) Applicant: Taiwan Semiconductor Manufacturing Co., Ltd., Hsin-Chu (TW)

(72) Inventors: Wei-Yu Tsai, Hsinchu (TW); Fu-Yao Nien, Hsinchu (TW); Hong-Wei Huang, Hsinchu (TW); Chang-Sheng Lee, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 523 days.

(21) Appl. No.: 17/395,195

(22) Filed: Aug. 5, 2021

(65) Prior Publication Data
US 2021/0376124 A1    Dec. 2, 2021

Related U.S. Application Data

(62) Division of application No. 16/573,552, filed on Sep. 17, 2019, now Pat. No. 11,088,262.
(Continued)

(51) Int. Cl.
*H10D 64/01* (2025.01)
*H01L 21/02* (2006.01)
(Continued)

(52) U.S. Cl.
CPC ..... *H10D 64/027* (2025.01); *H01L 21/02658* (2013.01); *H01L 21/28114* (2013.01);
(Continued)

(58) Field of Classification Search
CPC .. H10D 62/021; H10D 64/017; H10D 64/018; H10D 64/518; H10D 30/024;
(Continued)

(56) References Cited

U.S. PATENT DOCUMENTS 8,796,666 B1   8/2014   Huang et al.
8,815,712 B2   8/2014   Wan et al.
(Continued)

FOREIGN PATENT DOCUMENTS

CN   105529357 A   4/2016
JP    06104399 A   4/1994
(Continued)

*Primary Examiner* — Marcos D. Pizarro
(74) *Attorney, Agent, or Firm* — HAYNES AND BOONE, LLP

(57) ABSTRACT

A semiconductor device includes a substrate, an isolation structure on the substrate, a fin protruding from the substrate and through the isolation structure, a gate stack engaging the fin, and a gate spacer on sidewalls of the gate stack. The gate spacer includes an inner sidewall facing the gate stack and an outer sidewall opposing the inner sidewall. The inner sidewall has a first height measured from a top surface of the fin and a bowed structure in a top portion of the inner sidewall. The bowed structure extends towards the gate stack for a first lateral distance measured from a middle point of the inner sidewall. The first lateral distance is less than about 8% of the first height.

20 Claims, 21 Drawing Sheets

Related U.S. Application Data

(60) Provisional application No. 62/738,429, filed on Sep. 28, 2018.

(51) Int. Cl.
*H01L 21/28* (2025.01)
*H01L 21/3065* (2006.01)
*H10D 30/01* (2025.01)
*H10D 30/60* (2025.01)
*H10D 30/62* (2025.01)
*H10D 62/00* (2025.01)
*H10D 64/27* (2025.01)

(52) U.S. Cl.
CPC ....... *H01L 21/3065* (2013.01); *H10D 30/024* (2025.01); *H10D 30/026* (2025.01); *H10D 30/611* (2025.01); *H10D 30/6211* (2025.01); *H10D 30/6215* (2025.01); *H10D 30/6217* (2025.01); *H10D 30/6219* (2025.01); *H10D 62/021* (2025.01); *H10D 64/017* (2025.01); *H10D 64/018* (2025.01); *H10D 64/518* (2025.01)

(58) Field of Classification Search
CPC ............. H10D 30/026; H10D 30/6211; H10D 30/6217; H10D 30/6219; H01L 21/28114; H01L 21/3065; H01L 29/401; H01L 29/42376; H01L 29/66545; H01L 29/66795; H01L 29/7851; H01L 29/66621; H01L 21/66613–66628; H01L 29/66477–6656; H01L 29/66636; H01L 29/66613–66636; H01L 29/7381; H01L 29/7827–7832; H01L 29/7855; H01L 29/7853–7858; H01L 29/42372–42384; H01L 29/40–401; H01L 29/4232; H01L 29/42312–4232; H01L 29/4236; H01L 29/42356; H01L 29/6656; H01L 21/02658; H01L 21/28115; H01L 21/28–2815
USPC ....................................................... 257/365
See application file for complete search history.

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,620,621 B2* | 4/2017 | Chang | H01L 29/6656 |
| 9,978,760 B2* | 5/2018 | Zhang | H10B 41/30 |
| 10,686,076 B2* | 6/2020 | Ando | H01L 29/785 |
| 11,088,262 B2* | 8/2021 | Tsai | H01L 29/66795 |
| 11,522,068 B2* | 12/2022 | Shu | H01L 29/66545 |
| 2006/0022219 A1* | 2/2006 | Humbs | H01J 11/12 257/211 |
| 2009/0152241 A1 | 6/2009 | Miya et al. | |
| 2010/0295127 A1 | 11/2010 | Cheng et al. | |
| 2010/0308379 A1 | 12/2010 | Kuan et al. | |
| 2011/0227167 A1 | 9/2011 | Chuang et al. | |
| 2012/0238103 A1 | 9/2012 | Zhang et al. | |
| 2013/0285116 A1 | 10/2013 | Lochtefeld et al. | |
| 2014/0042543 A1 | 2/2014 | Cheng et al. | |
| 2014/0145263 A1 | 5/2014 | Cheng et al. | |
| 2014/0264491 A1 | 9/2014 | Huang et al. | |
| 2015/0187943 A1 | 7/2015 | Lee et al. | |
| 2015/0311073 A1 | 10/2015 | Srinivasan et al. | |
| 2016/0079412 A1 | 3/2016 | Tomita et al. | |
| 2016/0093728 A1* | 3/2016 | Decker | H01L 29/42368 438/270 |
| 2016/0141179 A1* | 5/2016 | Wu | H01L 21/28556 257/288 |
| 2017/0263604 A1* | 9/2017 | Lin | H01L 21/823468 |
| 2017/0288032 A1* | 10/2017 | Lu | H01L 21/31111 |
| 2018/0033866 A1 | 2/2018 | Liao et al. | |
| 2018/0047754 A1 | 2/2018 | Basker et al. | |
| 2018/0144949 A1 | 5/2018 | Chiu et al. | |
| 2018/0151440 A1 | 5/2018 | Liao et al. | |
| 2018/0315607 A1* | 11/2018 | Sharma | H01L 27/0886 |
| 2019/0006493 A1 | 1/2019 | Young et al. | |
| 2021/0328058 A1* | 10/2021 | Liang | H01L 21/283 |

FOREIGN PATENT DOCUMENTS

| | | |
|---|---|---|
| KR | 20060026836 | 3/2006 |
| KR | 20170088114 A | 8/2017 |
| KR | 20180013683 A | 2/2018 |
| TW | 201113935 A | 4/2011 |
| TW | 201432822 A | 8/2014 |
| TW | 201816858 A | 5/2018 |
| TW | 201816859 A | 5/2018 |
| TW | 201820482 A | 6/2018 |

* cited by examiner

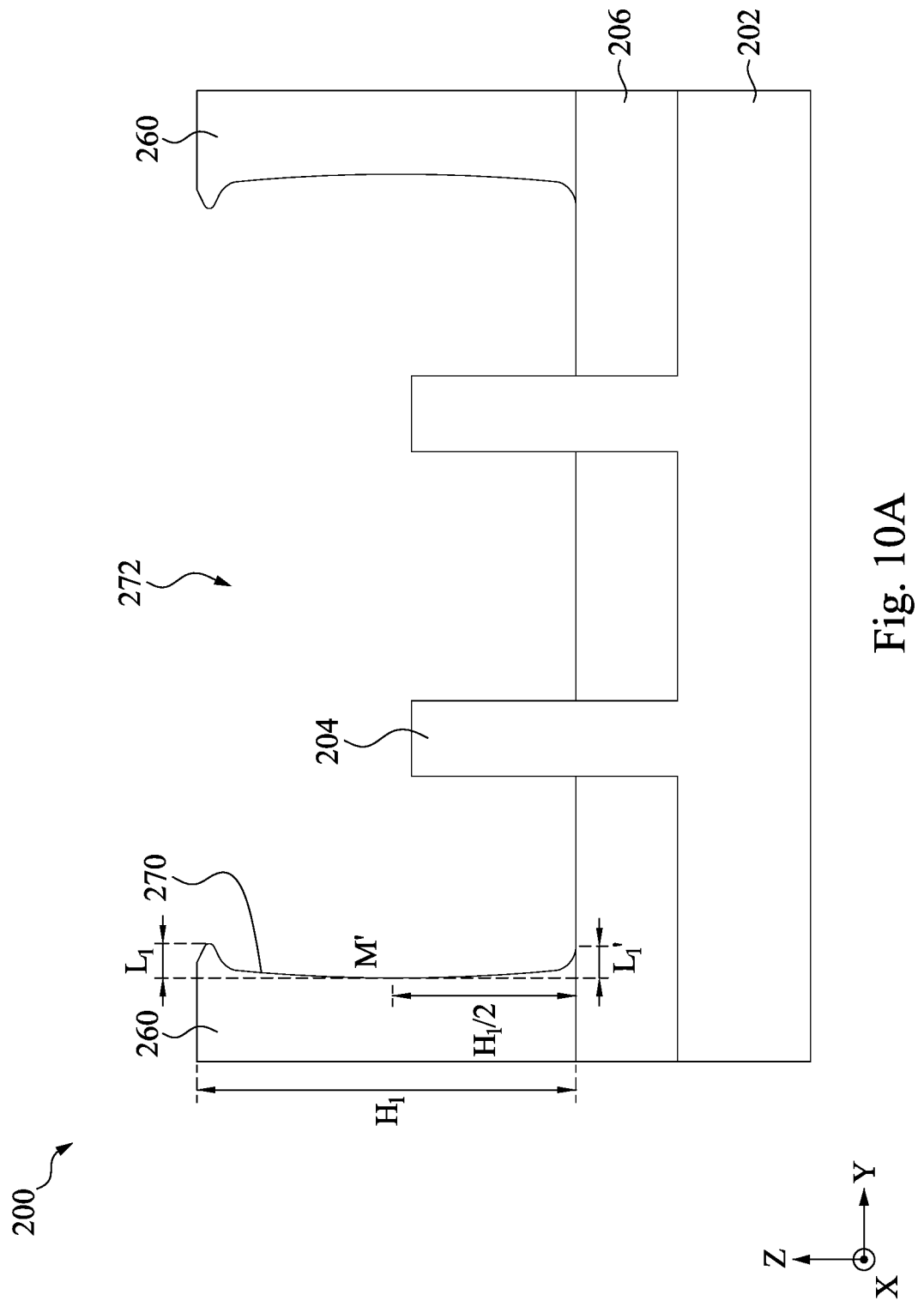

RADICAL ETCHING IN GATE FORMATION

PRIORITY DATA

This is a divisional application of U.S. patent application Ser. No. 16/573,552, filed on Sep. 17, 2019, which claims priority to U.S. Provisional Patent Application Ser. No. 62/738,429 entitled "Radical Etching in Gate Formation," filed on Sep. 28, 2018, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of the typically polysilicon gate with a metal gate to improve device performance with the decreased feature sizes. One process of forming a metal gate is termed a replacement gate or "gate-last" process in which the metal gate is fabricated after the polysilicon gate has been removed, which allows for a reduced number of subsequent processes, including high-temperature processing, that must be performed after formation of the gate. However, there are challenges to implementing such IC fabrication processes, especially with scaled-down IC features in advanced process nodes. In one example, during the removing of the polysilicon gate, a gate spacer's sidewall may be damaged, resulting in a non-straight sidewall profile. Accordingly, there exists a need for improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7A, 7B, 8A, 8B, 10A, 10B, 12A, 12B, 13A, 13B, 14A, 14B, and 15 illustrate cross-sectional views of a semiconductor device during a fabrication process according to the method of FIGS. 1 and 2, in accordance with some embodiments.

DETAILED DESCRIPTION

Figure 1:
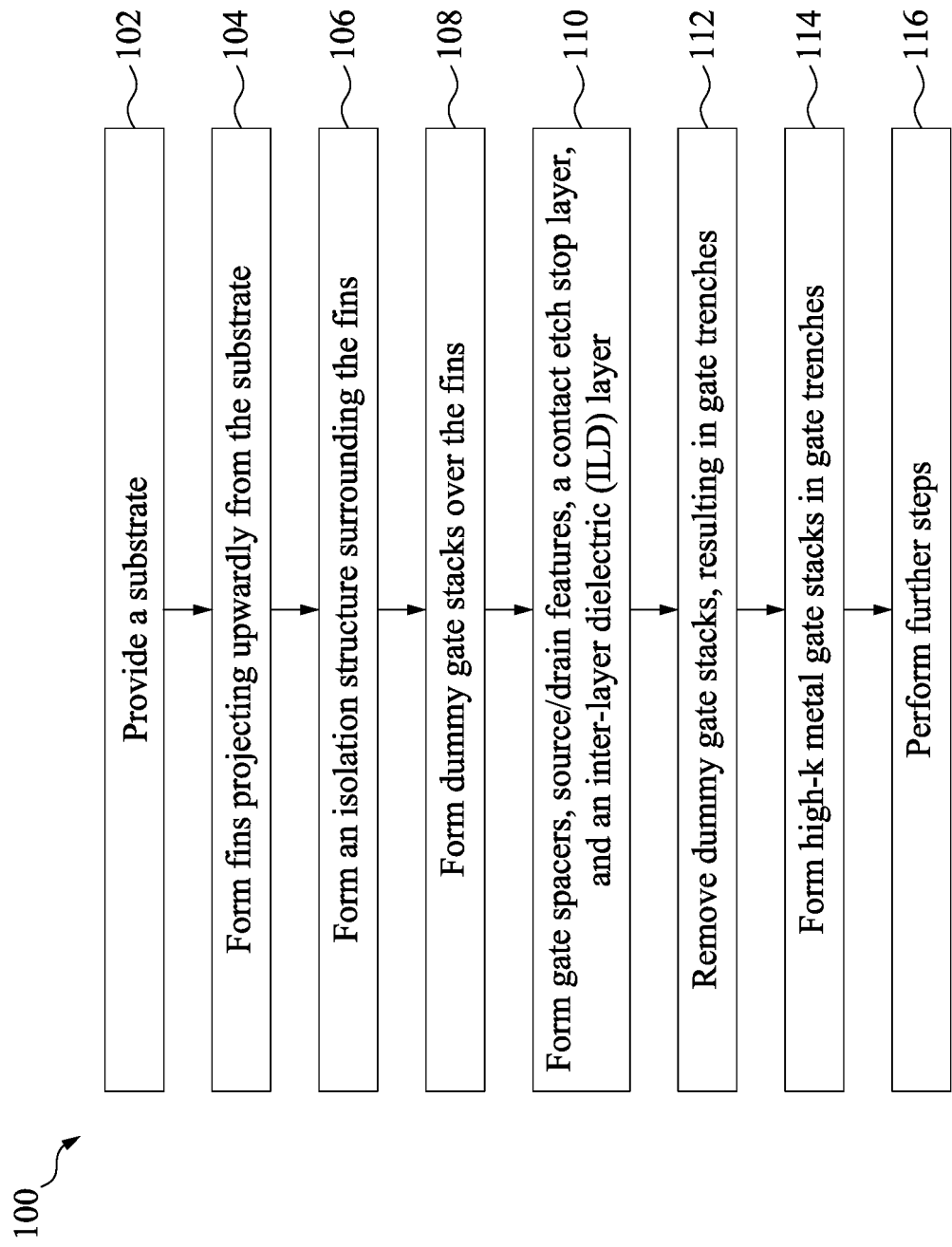
FIGS. 1 and 2 show a flow chart of a method for forming a semiconductor device, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to transistor gate formation using a selective radical etch process. In a replacement gate or "gate-last" process, a gate spacer's sidewall profile after a dummy gate removal process defines a subsequently formed metal gate's sidewall profile. A non-straight gate spacer's sidewall profile may include bowed heading, extended footing, and/or curvature sidewall, which would result in a similar sidewall profile of the metal gate abut the gate spacer. This may negatively impact the uniformity of the metal gate's performance. Some embodiments provide a gate spacer with substantially straight sidewalls during the dummy gate removal process. While exemplary methods find particular application in the processing of fin field-effect transistor (FinFET) semiconductor devices, they may also be employed in other applications, such as selective removal of various material layers from other workpieces, such as planar transistors, or the like.

Figure 2:
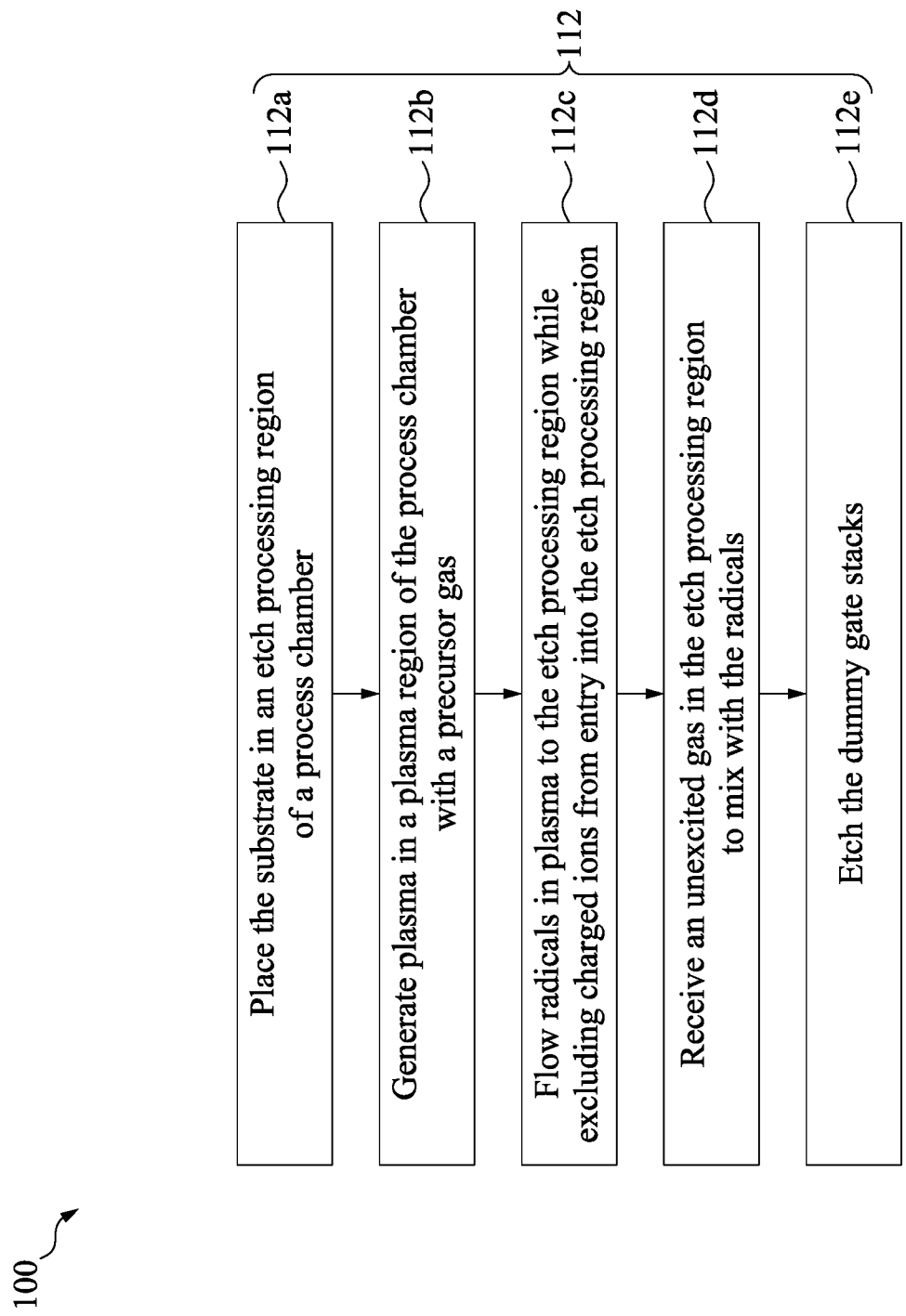

FIGS. 1 and 2 illustrate a flow chart of a method 100 for forming a semiconductor device, according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 3-15. FIGS. 3-8B, 10A, 10B, and 12A-15 illustrate various cross-sectional views of a semiconductor device 200 during fabrication steps according to the method 100. FIGS. 9 and 11 illustrate various exemplary etching process chamber suitable for use in certain operations of the method 100.

Figure 3:
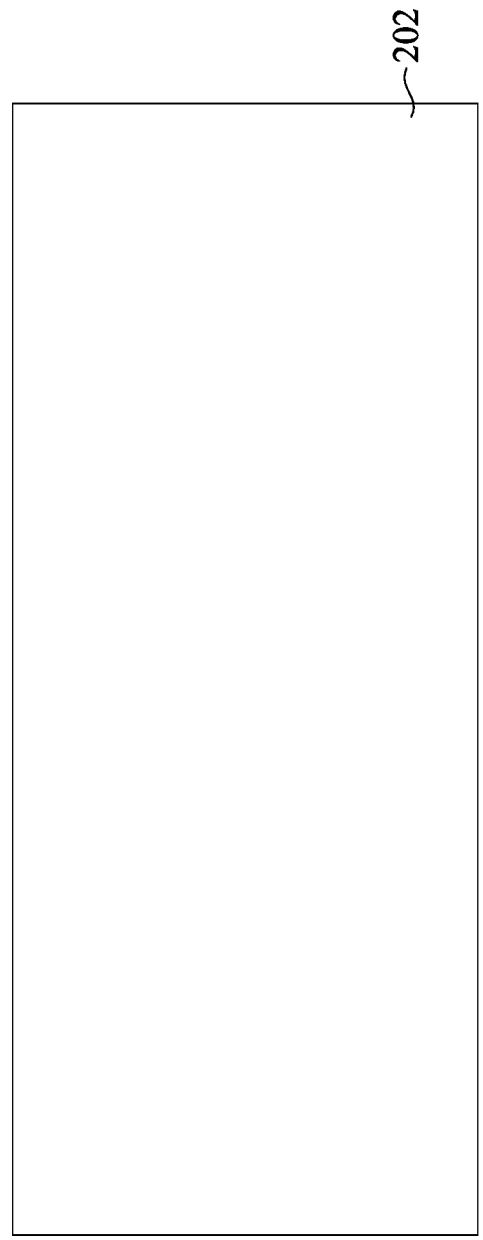

At operation 102, the method 100 (FIG. 1) provides, or is provided with, a semiconductor device 200 having a substrate 202, such as shown in FIG. 3. The substrate 202 is a silicon substrate in the illustrated embodiment. Alternatively, the substrate 202 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; and/or the like. In another embodiment, the substrate 202 includes indium tin oxide (ITO) glass. In an embodiment, the substrate 202 may be a wafer, such as a silicon wafer, and may include one or more epitaxially grown semiconductor layers in its upper portion.

Figure 4:
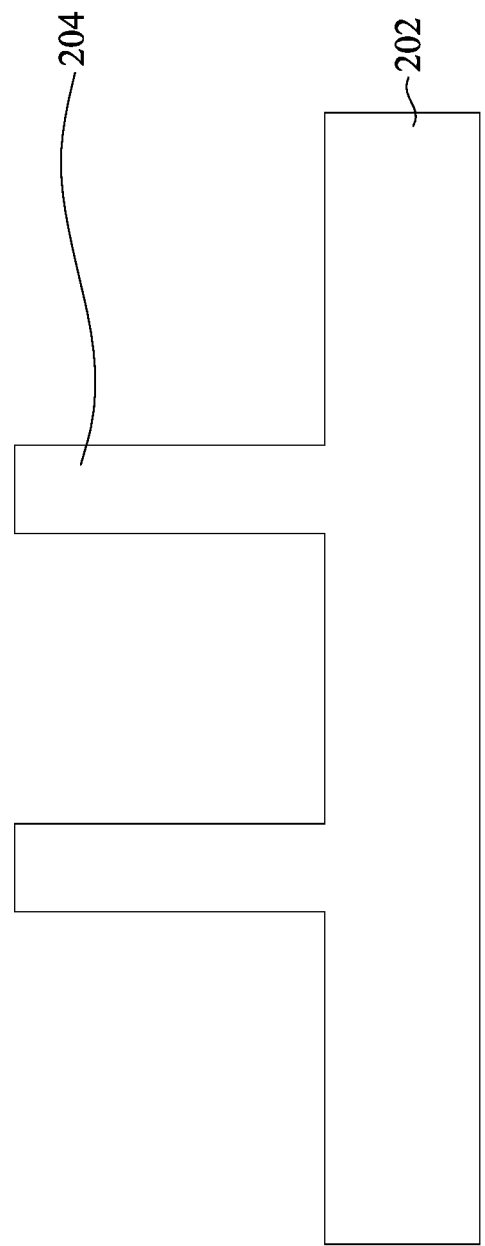

At operation 104, the method 100 (FIG. 1) forms fins 204 projecting upwardly from the substrate 202, as shown in FIG. 4. In the illustrated embodiment, the fins 204 extend lengthwise along the X direction and are spaced from each other in the Y direction. Further, the fins 204 are generally parallel to each other. The fins 204 can be formed by epitaxially growing one or more semiconductor layers over the entire area of the substrate 202 and then patterned to form the individual fins 204. The fins 204 may be patterned by any suitable method. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204 by etching the initial epitaxial semiconductor layers. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants.

In some embodiments, the fins 204 may comprise one or more semiconductor materials such as silicon, germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, and gallium indium arsenide phosphide. In an embodiment, the fins 204 may include alternately stacked layers of two different semiconductor materials, such as layers of silicon and silicon germanium alternately stacked. The fins 204 may additionally include dopants for improving the performance of the semiconductor device 200. For example, the fins 204 may include n-type dopant(s) such as phosphorus or arsenic, or p-type dopant(s) such as boron or indium.

Figure 5:
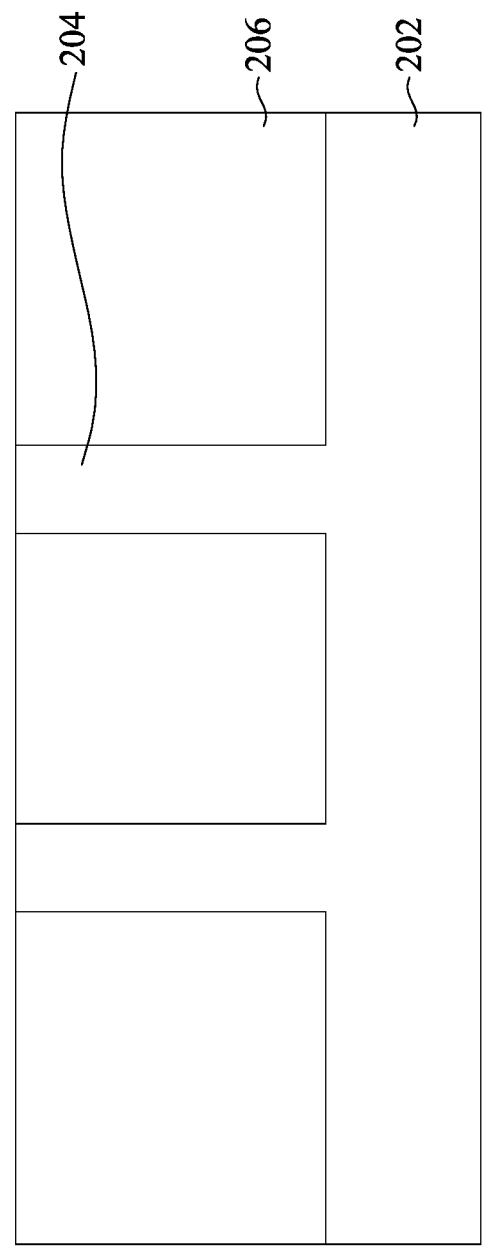
Figure 6:
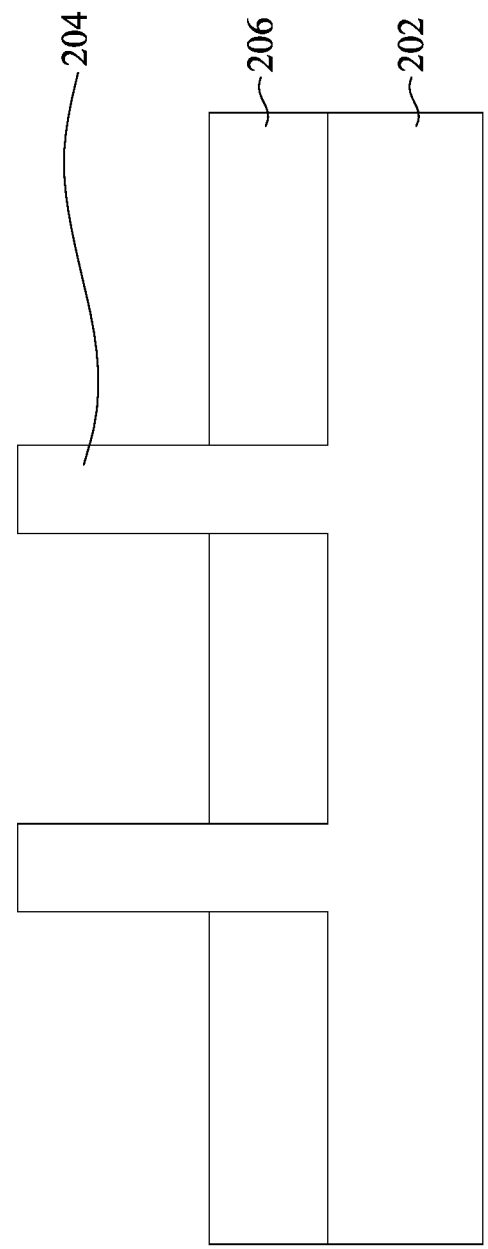

At operation 106, the method 100 (FIG. 1) forms an isolation structure 206 surrounding the fins 204. The operation 106 may include a variety of processes such as deposition (e.g., FCVD), annealing, chemical mechanical planarization (CMP), and etching back. The material for the isolation structure 206 may include undoped silicate glass (USG), fluoride-doped silicate glass (FSG), phosphosilicate glass (PSG), borophosphosilicate glass (BPSG), or other suitable insulating material. For example, the operation 106 may deposit a flowable dielectric material over the substrate 202 and filling spaces between the fins 204, such as shown in FIG. 5. In some embodiments, the deposition of the flowable dielectric material includes introducing a silicon-containing compound and an oxygen-containing compound that react to form a flowable dielectric material, thereby filling the gaps. Subsequently, operation 106 treats the flowable material with some annealing processes to convert the flowable dielectric material into a solid dielectric material. The annealing processes may include dry annealing or wet annealing with a temperature ranging from about 400° C. to about 550° C. Thereafter, operation 106 performs one or more CMP processes and/or etching back processes to recess the isolation structure 206. For example, operation 106 may employ one or more wet etching, dry etching, reactive ion etching, or other suitable etching methods in various embodiments to recess the isolation structure 206 to expose upper portions of the fins 204, such as shown in FIG. 6.

Figure 7A:
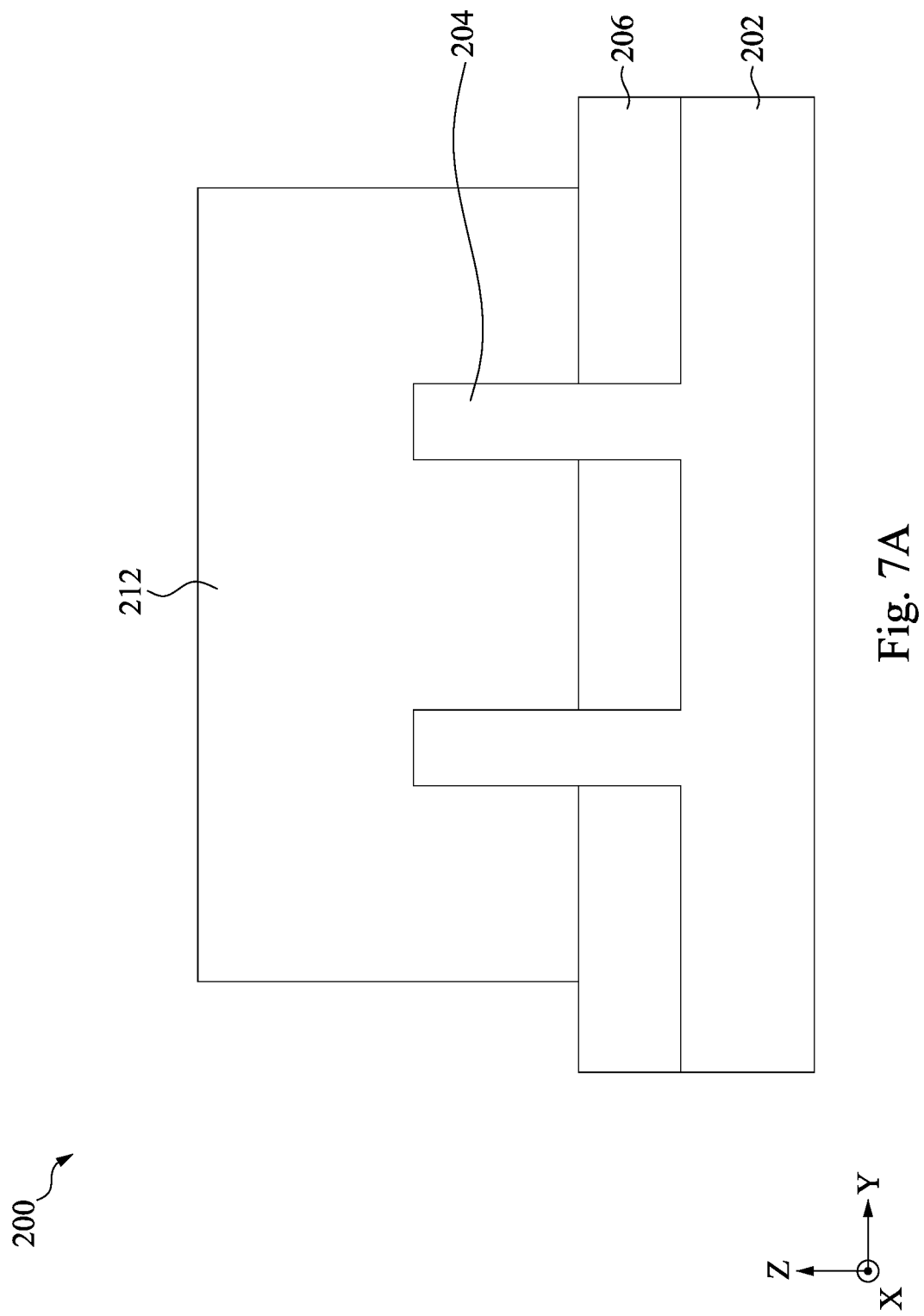
Figure 7B:
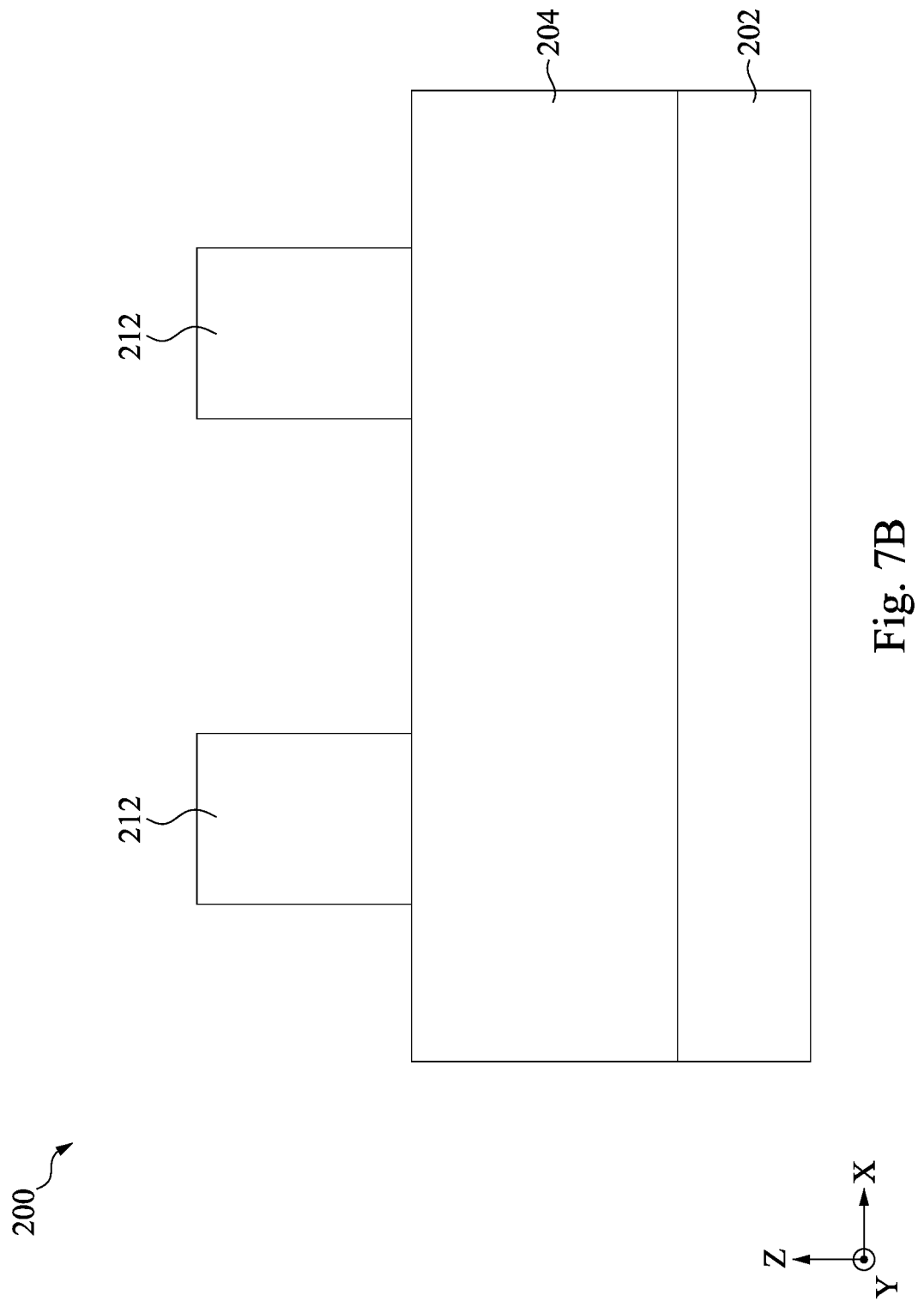

At operation 108, the method 100 (FIG. 1) forms dummy (or temporary) gate stacks 212 engaging the fins 204, such as shown in FIGS. 7A and 7B. FIG. 7A shows a cross-sectional view of the semiconductor device 200 in the Y-Z plane, while FIG. 7B shows a cross-sectional view of the semiconductor device 200 in the X-Z plane. In the illustrated embodiment, the dummy gate stacks 212 extend lengthwise along the Y direction, which is perpendicular to the lengthwise direction of the fins 204. The dummy gate stacks 212 will be subsequently replaced by final gate stacks, such as high-k metal gate stacks, in a gate-last process. In some embodiments, each dummy gate stack 212 includes a dummy gate dielectric layer and a dummy gate electrode layer (not shown). The dummy gate dielectric layer is formed over the exposed fins 204. The dummy gate dielectric layer may be formed by thermal oxidation, CVD, sputtering, or any other methods known and used in the art for forming a dummy gate dielectric layer. In one embodiment, the dummy gate dielectric layer is formed of the same material as the isolation structure 206. In other embodiments, the dummy gate dielectric layer may be made of one or more suitable dielectric materials such as silicon oxide (e.g., $SiO_2$), silicon nitride (e.g., $Si_3N_4$), silicon oxynitride (e.g., SiON), low-k dielectrics such as carbon doped oxides, extremely low-k dielectrics such as porous carbon doped silicon dioxide, a polymer such as polyimide, the like, or a combination thereof. In other embodiments, the dummy gate dielectric layer includes dielectric materials having a high dielectric constant (k value), for example, greater than 3.9. The materials may include metal oxides such as $HfO_2$, $HfZrO_x$, $HfSiO_x$, $HfTiO_x$, $HfAlO_x$, TiN, the like, or a combination thereof. Subsequently, the dummy gate electrode layer is formed over the dummy gate dielectric layer. In some embodiments, the dummy gate electrode layer is a conductive material and may be selected from a group comprising poly-crystalline silicon (poly-Si), poly-crystalline silicon-germanium (poly-SiGe), silicon nitride (e.g., $Si_3N_4$), metallic nitrides, metallic silicides, and metallic oxides. In an embodiment, the dummy gate electrode layer may be deposited by PVD, CVD, sputter deposition, or other techniques known and used in the art for depositing conductive materials. The top surface of the dummy gate electrode layer usually has a non-planar top surface and may be planarized in one or more CMP processes after it is deposited. The dummy gate dielectric layer and dummy gate electrode layer may be patterned by photolithography and etching processes to form the dummy gate stacks 212.

Figure 8A:
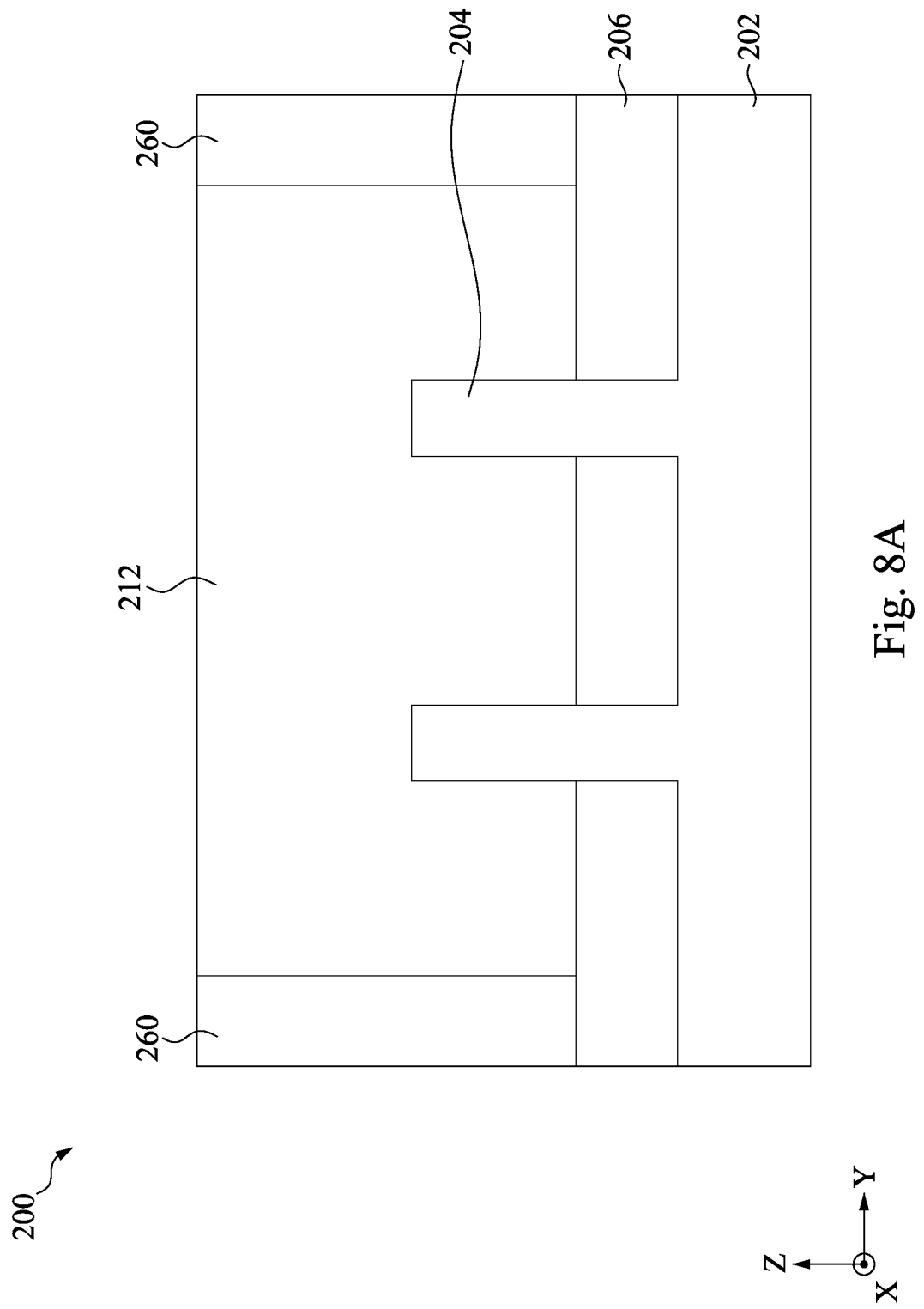
Figure 8B:
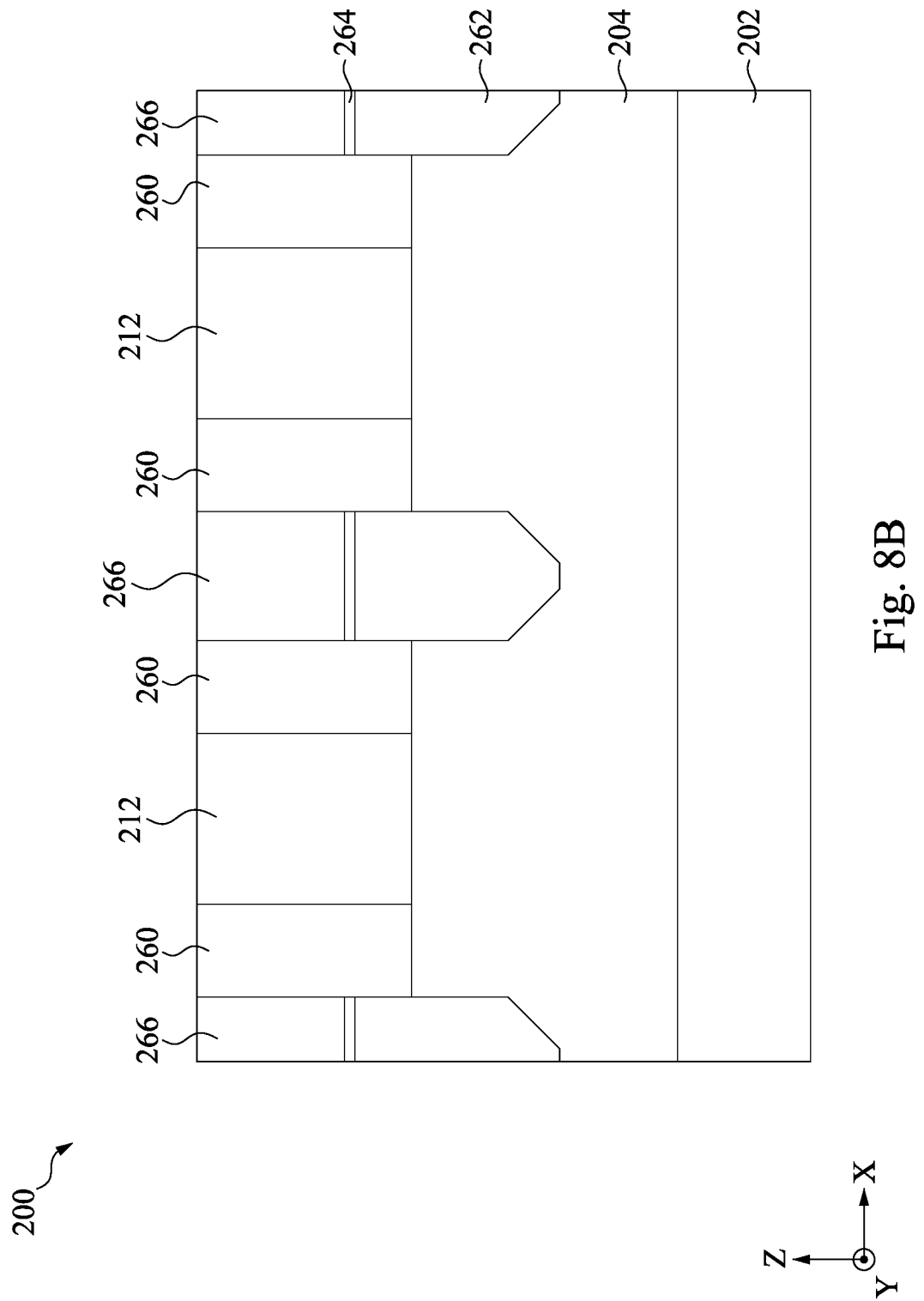
Figure 9:
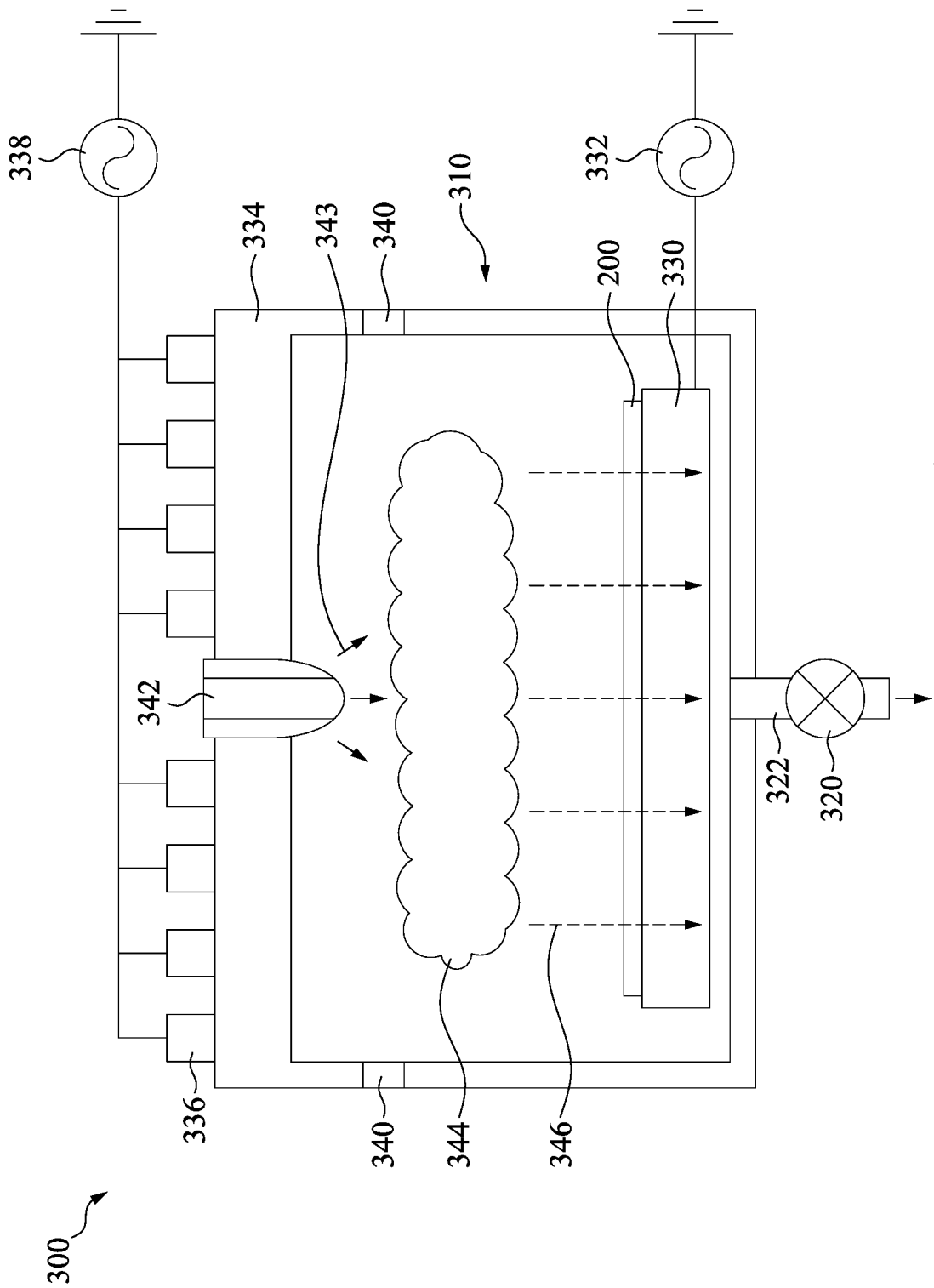
FIGS. 9 and 11 show exemplified process chambers used in an etch process according to the method of FIGS. 1 and 2, according to aspects of the present disclosure.

At operation 110, the method 100 (FIG. 1) forms various features in or over the fins 204, including gate spacers 260, source/drain (S/D) features 262, a contact etch stop layer (CESL) 264, an interlayer dielectric (ILD) layer 266, such as shown in FIGS. 8A and 8B. FIG. 8A shows a cross-sectional view of the semiconductor device 200 in the Y-Z plane, while FIG. 8B shows a cross-sectional view of the semiconductor device 200 in the X-Z plane. Operation 110 includes a variety of processes.

In some embodiments, operation 110 forms the gate spacers 260 on sidewalls of the dummy gate stacks 212. In the illustrated embodiment, the gate spacers 260 are formed on each side of the dummy gate stacks 212. The gate spacers 260 may be used to offset the subsequently formed S/D features 262. The gate spacers 260 may comprise a dielectric material, such as silicon oxide, silicon nitride, silicon oxynitride, silicon carbide, other dielectric material, or combinations thereof, and may comprise one or multiple layers of material. The gate spacers 260 may be formed by depositing a spacer material as a blanket over the isolation structure 206, the fins 204, and the dummy gate stacks 212. Then the spacer material is etched by an anisotropic etching process. Portions of the spacer material on the sidewalls of the dummy gate stacks 212 remain and become the gate spacers 260.

Then, operation 110 forms the S/D features 262 over the fins 204, the CESL 264 over the S/D features 262, the ILD layer 266 over the CESL 264. For example, operation 216 may etch recesses into the fins 204 adjacent to the gate spacer 260, and epitaxially grow semiconductor materials in the recesses. The semiconductor materials may be raised above the top surface of the fins 204. Operations 110 may form the S/D features 262 separately for NFET and PFET devices. For example, operations 110 may form the S/D features 262 with n-type doped silicon for NFET devices or p-type doped silicon germanium for PFET devices. In a particular embodiment, the S/D features 262 are in-situ doped during the epitaxial process by introducing doping species including: p-type dopants, such as boron or $BF_2$; n-type dopants, such as phosphorus or arsenic; and/or other suitable dopants including combinations thereof. If the S/D features 262 are not in-situ doped, an implantation process (i.e., a junction implant process) is performed to dope the S/D features 262. For example, the S/D features 262 in NFET devices include SiP, while those in PFET devices include GeSnB (tin may be used to tune the lattice constant) and/or SiGeSnB. One or more annealing processes may be performed to activate the S/D features 262. Suitable annealing processes include rapid thermal annealing (RTA) and/or laser annealing processes.

Thereafter, operation 110 may deposit the CESL 264 and the ILD layer 266 over the S/D features 262. The CESL 264 may comprise silicon nitride, silicon oxynitride, silicon nitride with oxygen (O) or carbon (C) elements, and/or other materials; and may be formed by CVD, PVD, ALD, or other suitable methods. The ILD layer 266 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 266 may be formed by plasma enhanced CVD (PECVD), flowable CVD (FCVD), or other suitable methods. In a particular embodiment, the gate spacers 260 is nitride rich, such as mainly containing silicon nitride, while the ILD layer 266 is oxide rich, such as mainly containing silicon oxide. Subsequently, operation 110 may perform one or more CMP processes to planarize the top surface of the semiconductor device 200.

At operation 112, the method 100 (FIG. 1) removes the dummy gate stacks 212 to form gate trenches. In various embodiments, operation 112 uses a dry etch process. Relatively speaking, the merits of implementing a dry etch process are due mainly to its simplicity of controlling the gaseous etchants and its result of producing more repeatable results than other processes, such as a wet etch method. Many process parameters, such as gas pressure, chemistry, and the source/biased power can be varied or modified during the dry etch process for fine tuning.

The dry etching process may use anisotropic etching (e.g., a plasma etching) or isotropic etching (e.g., radical etching, where radicals are generated by filtering a plasma). In one particular embodiment of operation 112, an anisotropic etching method is used to etch the dummy gate stacks 212, such as plasma etching (or reactive-ion etching (RIE)). An exemplary process chamber 300 suitable for plasma etching is illustrated in FIG. 9. The process chamber 300 includes a vacuum chamber 310 as an etch processing region. The vacuum chamber 310 is in fluid communication with a vacuum source 320 via a passage 322. The vacuum source 320 can include one or more vacuum pumps. The vacuum source 320 is operable in maintaining the interior of the vacuum chamber 310 at a suitable low pressure (e.g., below 100 mTorr). The process chamber 300 also includes a chuck 330 for holding the semiconductor device 200. For example, the chuck 330 may be a cantilevered electrostatic chuck, and the semiconductor device 200 is positioned on the chuck 330 by an electrostatic clamp, a mechanical clamp, or other clamping mechanisms. The chuck 330 is conductive and electrically coupled to a bias voltage source 332. The gas injectors 342 provide precursor gas 343 to generate plasma within the vacuum chamber 310. The process chamber 300 further includes a dielectric top cover 334 with a plurality of electrodes 336 mounted thereon. The dielectric top cover 334 and the electrodes 336 may further be insulated by the insulation members 340 from the side and bottom portions of the vacuum chamber 310. The electrodes 336, such as antennas or planar coils, are powered by a suitable radio frequency (RF) power source 338 to transmit RF energy into the vacuum chamber 310. The RF energy can excite the precursor gas 343 inside the vacuum chamber 310 into plasma 344. Coupled with the RF energy, the bias voltage source 332 creates a biased electric field 346 towards the semiconductor device 200. Driven by the biased electric field 346, charged ions in the plasma 344 bombard the top surface of the semiconductor device 200 similar to sputtering. The bombardment accelerates the etch rate parallel to the ion trajectories, resulting in the anisotropic etching. In furtherance of the embodiment, the precursor gas 343 may contain a mixture of $CF_4$ and $Cl_2$ (i.e., $CF_4/Cl_2$ plasma). Alternatively, the precursor gas 343 may contain a mixture of HBr and $O_2$ (i.e., $HBr/O_2$ plasma). The etching process may be applied with a $CF_4/Cl_2$ (or $HBr/O_2$) flow rate at about 500 sccm, a gas pressure at about 60 mtorr, an RF power less than about 1000 W, and a bias voltage less than about 200 V.

Figure 10B:
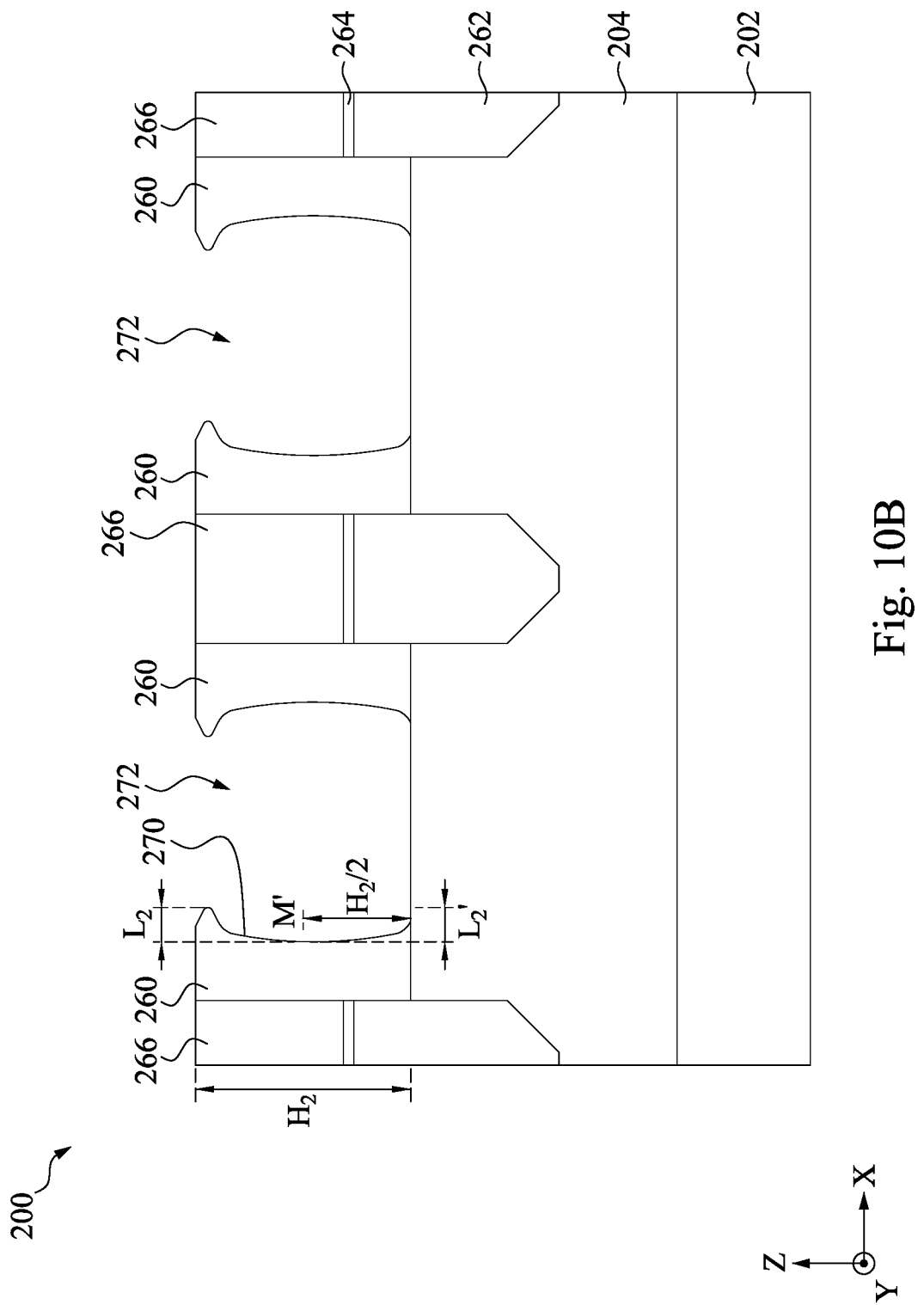
Figure 11:
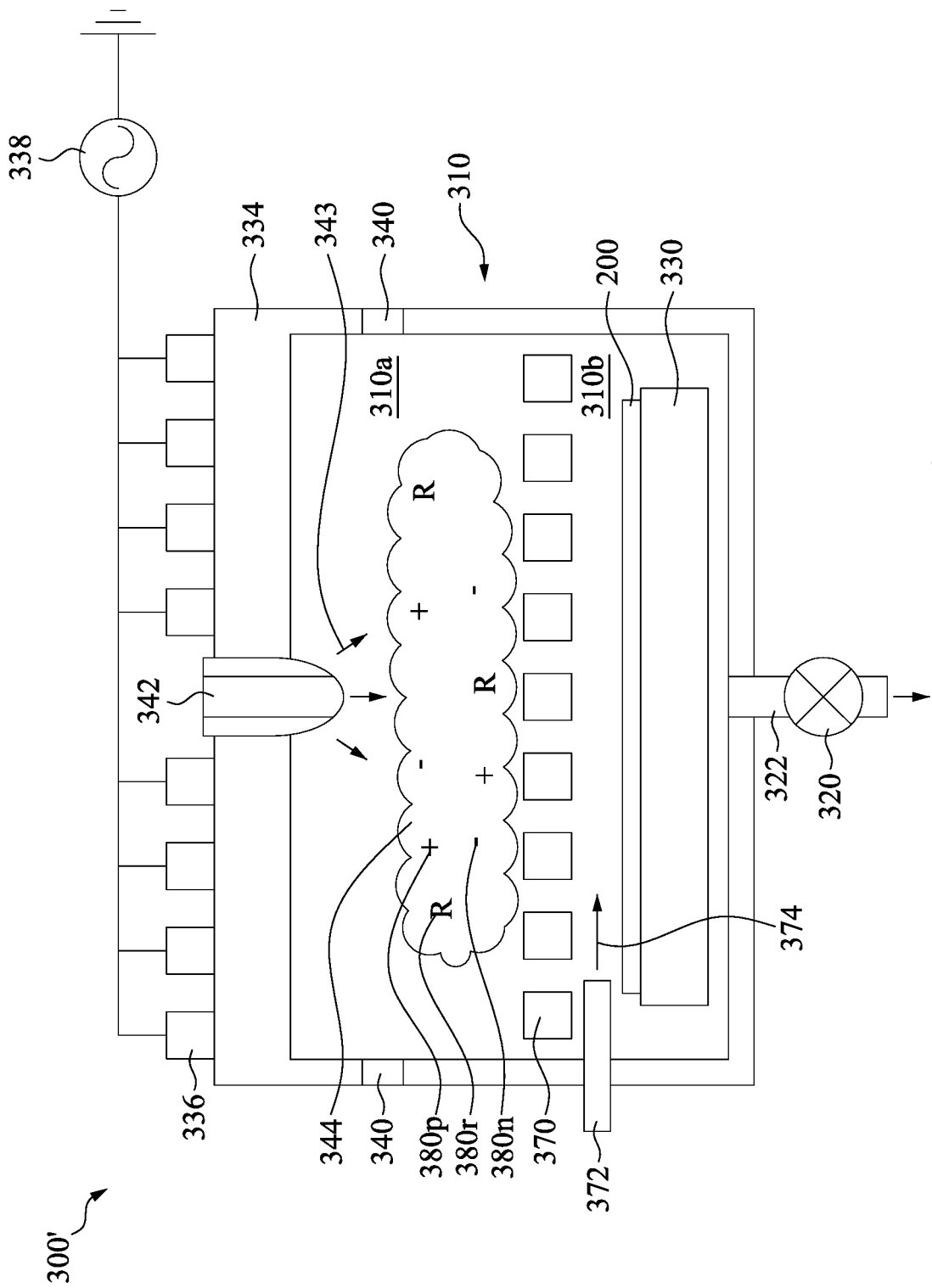

The inventors of the present disclosure have observed that ion bombardment during an anisotropic etching process may cause damages to sidewalls of the gate spacer 260, resulting in non-straight sidewalls, as shown in FIGS. 10A and 10B. FIG. 10A shows a cross-sectional view of the semiconductor device 200 in the Y-Z plane, while FIG. 10B shows a cross-sectional view of the semiconductor device 200 in the X-Z plane. As illustrated in FIGS. 10A and 10B, the sidewall 270 of the gate spacer 260, which faces the gate trench 272, has a non-straight profile. The non-straight profile may be mainly caused by ions reflected from the top surface of the dummy gate stack during the bombardment which hit the sidewall 270 thereafter.

As illustrated in FIG. 10A, the middle point M of the sidewall 270 is defined as a point having a vertical distance to a top surface of the isolation structure 206 which is half of the height $H_1$ of the gate spacer 260 ($H_1$ is measured from a topmost portion of the gate spacer 260 vertically to the top surface of the isolation structure 206). The middle portion of the sidewall 270 has a curvature shape around the middle point M bending away from the gate trench 272. The top portion of the sidewall 270 has a bowed structure extending towards the gate trench 272 for a first lateral distance $L_1$ measured from the middle point M along the Y direction to a tip of the bowed structure. The bottom portion of the sidewall 270 has a footing structure extending towards the gate trench 272 for a second lateral distance $L_1'$ measured from the middle point M along the Y direction to a tip of the footing structure. The inventors of the present disclosure have observed that an anisotropic etching process often results in $L_1/H_1$ and $L_1'/H_1$ both larger than about 8%.

Similarly, as shown in FIG. 10B, the middle point M' is defined as a point on the sidewall 270 having a vertical distance to a top surface of the fin 204 which is half of the height $H_2$ of the gate spacer 260 ($H_2$ is measured from a topmost portion of the gate spacer 260 vertically to the top surface of the fin 204). The middle portion of the sidewall 270 has a curvature shape around the middle point M' bending away from the gate trench 272. The top portion of the sidewall 270 has a bowed structure extending towards the gate trench 272 for a first lateral distance $L_2$ measured from the middle point M' along the X direction to a tip of the bowed structure. The bottom portion of the sidewall 270 has a footing structure extending towards the gate trench 272 for a second lateral distance $L_2'$ measured from the middle point M' along the X direction to a tip of the footing structure. The inventors of the present disclosure have observed that an anisotropic etching process often results in $L_2/H_2$ and $L_2'/H_2$ both larger than about 8%.

In an alternative embodiment of operation 112, as shown in FIG. 2, an isotropic etching method using radicals is applied to etch the dummy gate stacks 212 without applying a biased electric field towards the semiconductor device 200 to avoid causing charged ion bombardment. Therefore, this isotropic etching method is also referred to as a radical etching. The term "radical" as used herein indicates an atom or a molecule with at least one unpaired valence electron and appears electric neutral. The unpaired electron(s) make radicals highly chemically reactive. The term "radical etching" as used herein indicates an etch process using radicals as etchants and substantially excluding charged ions from participating in the etching.

An exemplary process chamber 300' suitable for radical etching is illustrated in FIG. 11. Many components of the process chamber 300' with repeated reference numerals are similar to the ones of the process chamber 300 illustrated in FIG. 9 and are not repeated below in the interest of conciseness. Different from the process chamber 300, the process chamber 300' does not bias the chuck 330 to a voltage source. As a result, the semiconductor device 200 positioned on the chuck 330 would not be surrounded by a biased electric field. Further, the vacuum chamber 310 of the process chamber 300' is divided by a selective modulation device 370 into a plasma region 310a and an etch processing region 310b. The semiconductor device 200 is positioned in the etch processing region 310b. The process chamber 300' may further include a gas injector 372 coupled to the etch processing region 310b to provide a second precursor gas 374 other than the first precursor gas 343 into the etch processing region 310b.

The selective modulation device 370 may be an electrically charged grating that acts as a barrier to the movement of charged ions from plasma while allowing uncharged plasma components (e.g., radicals) to pass through the selective modulation device 370. In an embodiment, the selective modulation device 370 can prevent the charged plasma ions (e.g., positively charged ions or negatively formed ions) from passing by either repelling the charged plasma ions or else by attracting the charged plasma ions. However, any suitable device that can separate radicals from plasma may be utilized.

Referring to FIGS. 2 and 11 collectively, one embodiment of operation 112 using radical etching begins with step 112a in which the semiconductor substrate is placed in the etch processing region 310b of the process chamber 300'. In step 112b, a plasma 344 is generated in the plasma region 310a with the first precursor gas 343. The precursor gas 343 may comprise one or more first gaseous components. In a representative example, first precursor gas 343 may comprise, e.g., nitrogen trifluoride ($NF_3$) as a source of fluorine radical; although other radical sources may be alternatively, conjunctively, or sequentially employed. For example, in another representative example, first precursor gas 450 may comprise nitrogen trifluoride ($NF_3$) as a source of fluorine radical and molecular hydrogen ($H_2$) as a source of hydrogen radical in accordance with the following: $NF_3 + H_2 \rightarrow NF^* + NF_2^* + F^* + H^* + HF + N^*$ (* marks a radical component). The first precursor gas 343 is energized to form plasma 344 comprising positive ions 380p, negative ions 380n, and radicals 380r disposed in the plasma region 310a. For example, RF (radio frequency) energy generated by the RF power source 338 may be employed to form plasma 344. In some embodiments, the RF power may be between about 10 Watts and about 2500 Watts, such as between about 500 Watts and about 1500 Watts. In a specific example, the RF power is about 1200 Watts. In some embodiments, plasma 344 may be generated in a separate region (e.g., as in the case of a remote plasma) and subsequently introduced to the plasma region 310a. In step 112c, radicals 380r of the plasma 344 separately flow from the plasma region 310a to the etch processing region 310b. In the illustrated embodiments, the selective modulation device 370 permits passage of radicals 380r into the etch processing region 310b, while substantially retaining positive ions 380p and negative ions 380n of plasma 344 in the plasma region 310a. In step 112d, an unexcited gas 374 is introduced as the second precursor to (and chemically combined with) the radicals 380r in the etch processing region 310b. The unexcited gas 374 may comprise one or more gaseous components. Although FIG. 1B representatively illustrates the introduction of the radicals 380r to the etch processing region 310b before the introduction of the unexcited gas 374, other sequences of introduction are possible. For example, in one embodiment, the unexcited gas 374 may be introduced to the etch processing region 310b before the radicals 380r. In another embodiment, the unexcited gas 374 may be introduced substantially simultaneously with the introduction of the radicals 380r. In accordance with a representative example employing a mixture of nitrogen trifluoride ($NF_3$) and molecular hydrogen ($H_2$) as the first precursor gas 343 and molecular hydrogen ($H_2$) as the unexcited gas (the second precursor gas) 374, fluorine (F) and hydrogen (H) radicals 380r combine with molecular hydrogen ($H_2$) to form a complex of atomic hydrogen (H) and fluorine (F) radicals in accordance with the following: $F^*+H_2 \rightarrow HF+H^*$. Providing the unexcited gas 374 into the etch processing region 310b fine tunes a ratio of the number of fluorine atoms to the number of hydrogen atoms (F/H) in the etch processing region 310b, which will be further discussed below.

In step 112e, the dummy gate stacks 212 are etched with products formed by chemical reaction of the radicals in a surface adsorption/desorption process. Hydrogen (H) catalyzes the etching process. In one embodiment, the dummy gate stacks 212 includes polysilicon (Si) and in a surface adsorption process, the complex of atomic hydrogen (H) and fluorine (F) radical combines with polysilicon (Si) to form silicon tetrafluoride ($SiF_4$) and molecular hydrogen ($H_2$) as surface desorbed gaseous reaction byproducts. In accordance with some embodiments described herein, the selectivity of polysilicon-containing dummy gate stacks 212 etch rate to silicon nitride-containing gate spacers 260 etch rate may be larger than about 25:1, such as from about 50:1 to about 100:1 (for example about 60:1). Accordingly, radical etching in operation 112 is regarded as a selective isotropic etching substantially free of ion bombardment.

Figure 12A:
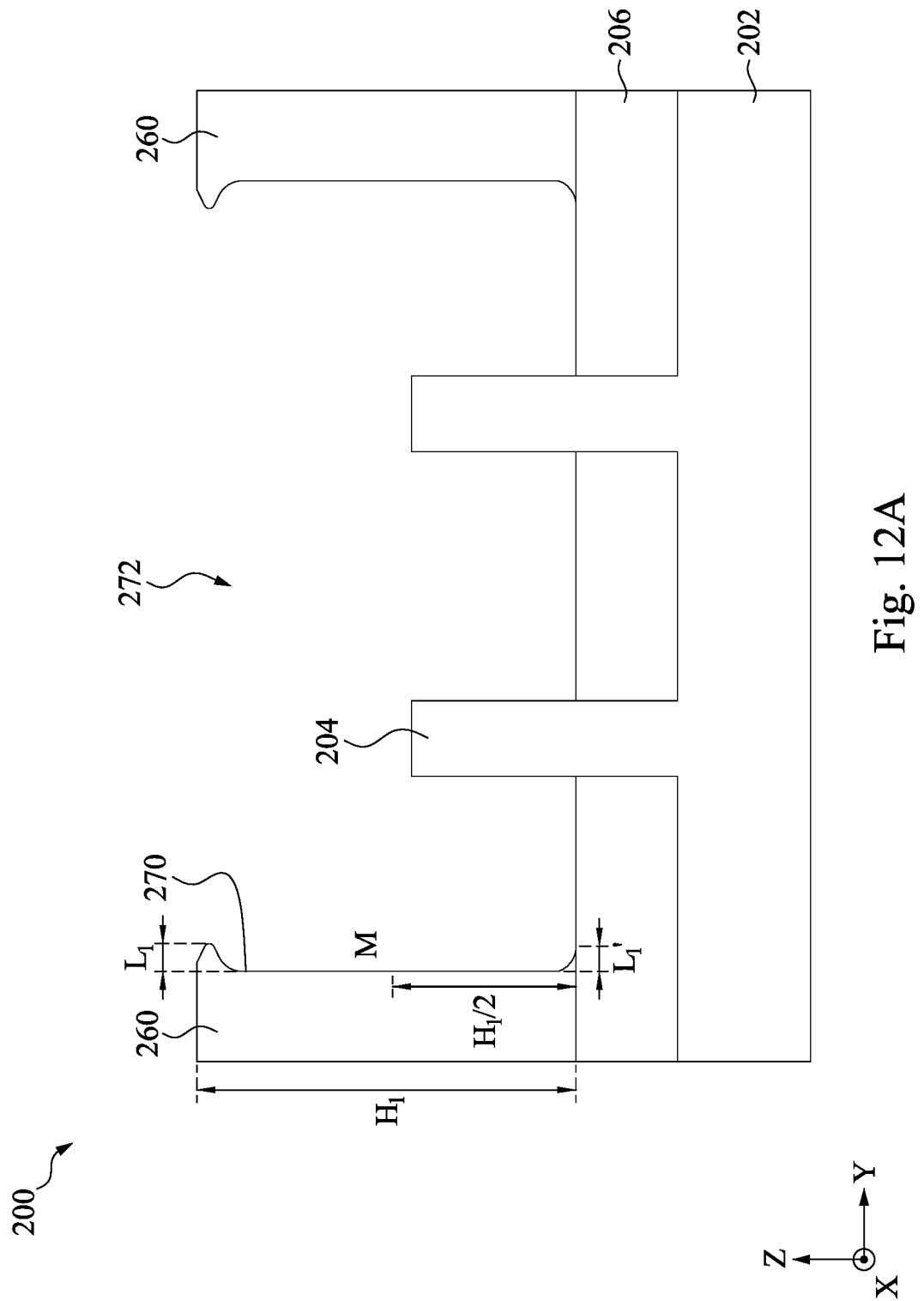
Figure 12B:
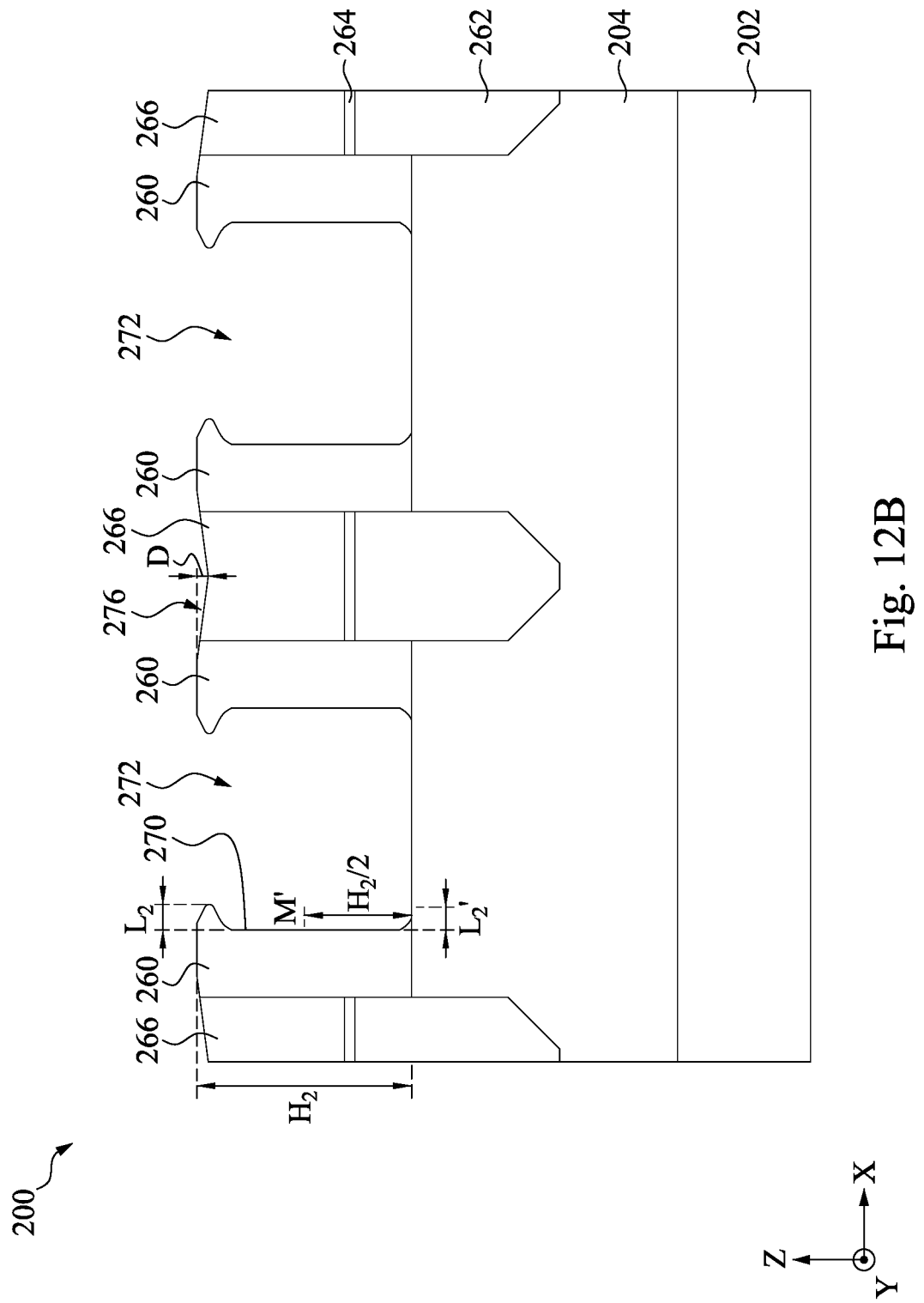

FIGS. 12A and 12B illustrate the semiconductor device 200 after the dummy gate stacks 212 are removed by radical etching of operation 112. FIG. 12A shows a cross-sectional view of the semiconductor device 200 in the Y-Z plane, while FIG. 12B shows a cross-sectional view of the semiconductor device 200 in the X-Z plane. Compared with FIGS. 10A and 10B where ion bombardment is applied, the gate spacers 260 substantially does not suffer from sidewall damages due to the applying of radical etch which is free of ion bombardment. The middle portion of the sidewall 270 is substantially straight. The bowed structure in the top portion of the sidewall 270 and the footing structure in the bottom portion of the sidewall 270 are both significantly reduced in dimensions. In various embodiments, operation 112 with radical etching often results in $L_1/H_1$ and $L_1'/H_1$ (referring to FIG. 12A) both less than about 8%, such as less than about 3% (e.g., about 2% in a specific example), and $L_2/H_2$ and $L_2'/H_2$ (referring to FIG. 12B) both less than about 8%, such as less than about 3% (e.g, about 2% in a specific example). The inventors of the present disclosure have observed that when the above ratio is larger than about 8%, the uniformity of gate structure performance deteriorates, while when the above ratios are less than about 8%, the uniformity of gate structure performance is enhanced.

In a particular embodiment, the gate spacers 260 is nitride rich, such as mainly containing silicon nitride, while the ILD layer 266 is oxide rich, such as mainly containing silicon oxide, and the radical etching of operation 112 uses fluorine (F) and hydrogen (H) radicals as etchant which has a higher etch rate of oxide rich material than nitride rich material. Accordingly, the ILD layer 266 may suffer higher etching loss on its top surface than the gate spacer 260 during operation 112. As a result, between two adjacent gate trenches 272, a top surface of the combined structure of gate spacer-ILD layer-gate spacer exhibits a recess 276 with the lowest point at about the center of the ILD layer 266, as shown in FIG. 12B. The sidewall 270 of the gate spacer 260 facing the gate trench 272 is also higher than the opposing sidewall facing the ILD layer 266. The depth of the recess 276 is denoted as D. A ratio of the depth of the recess 276 to the height of the gate spacer 260 ($D/H_2$) may be larger than about 3% in some examples. The inventors of the present disclosure have observed a $D/H_2$ larger than about 3% provides the performance benefits of larger landing areas for S/D contacts that are subsequently formed.

Figure 13A:
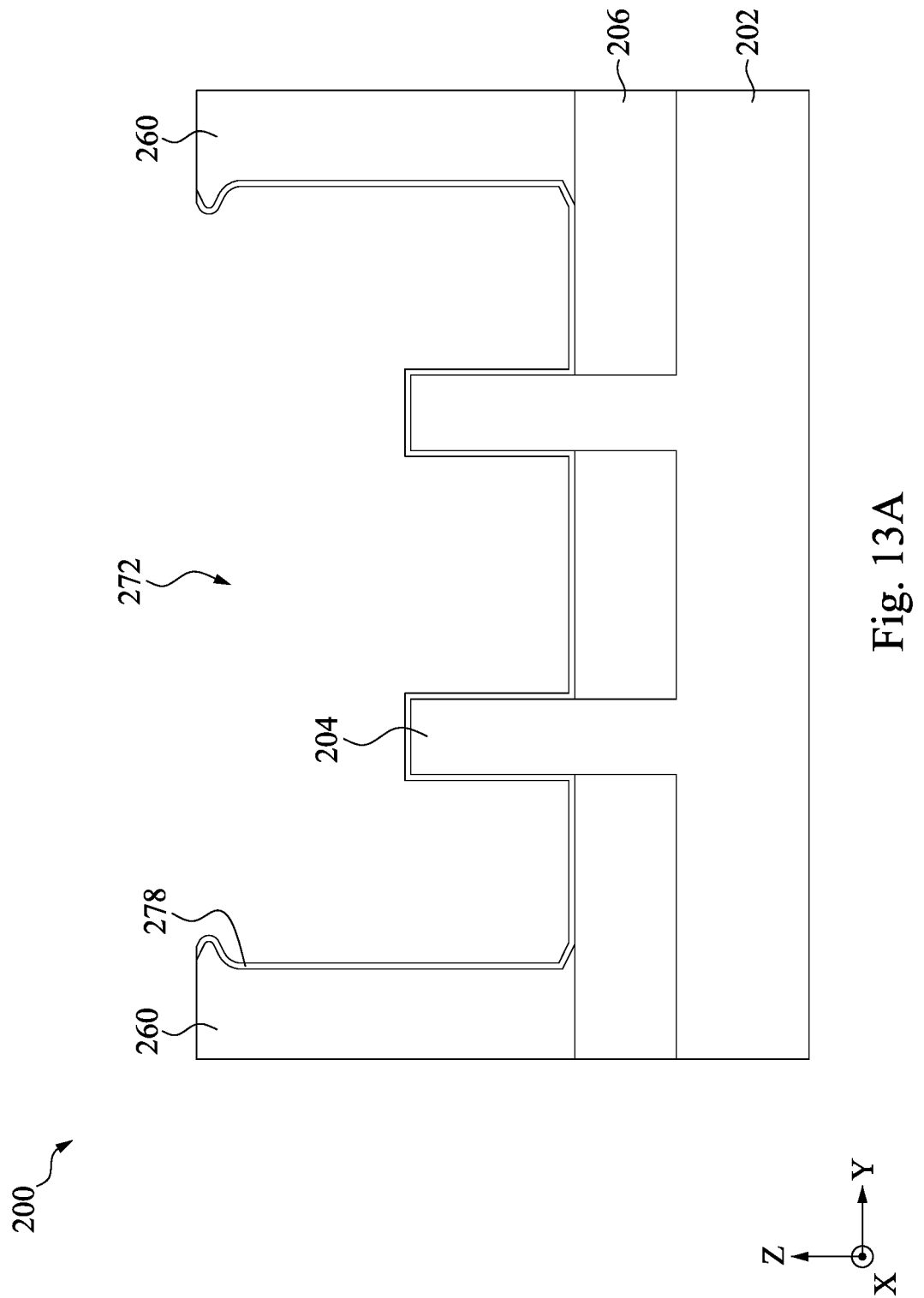
Figure 13B:
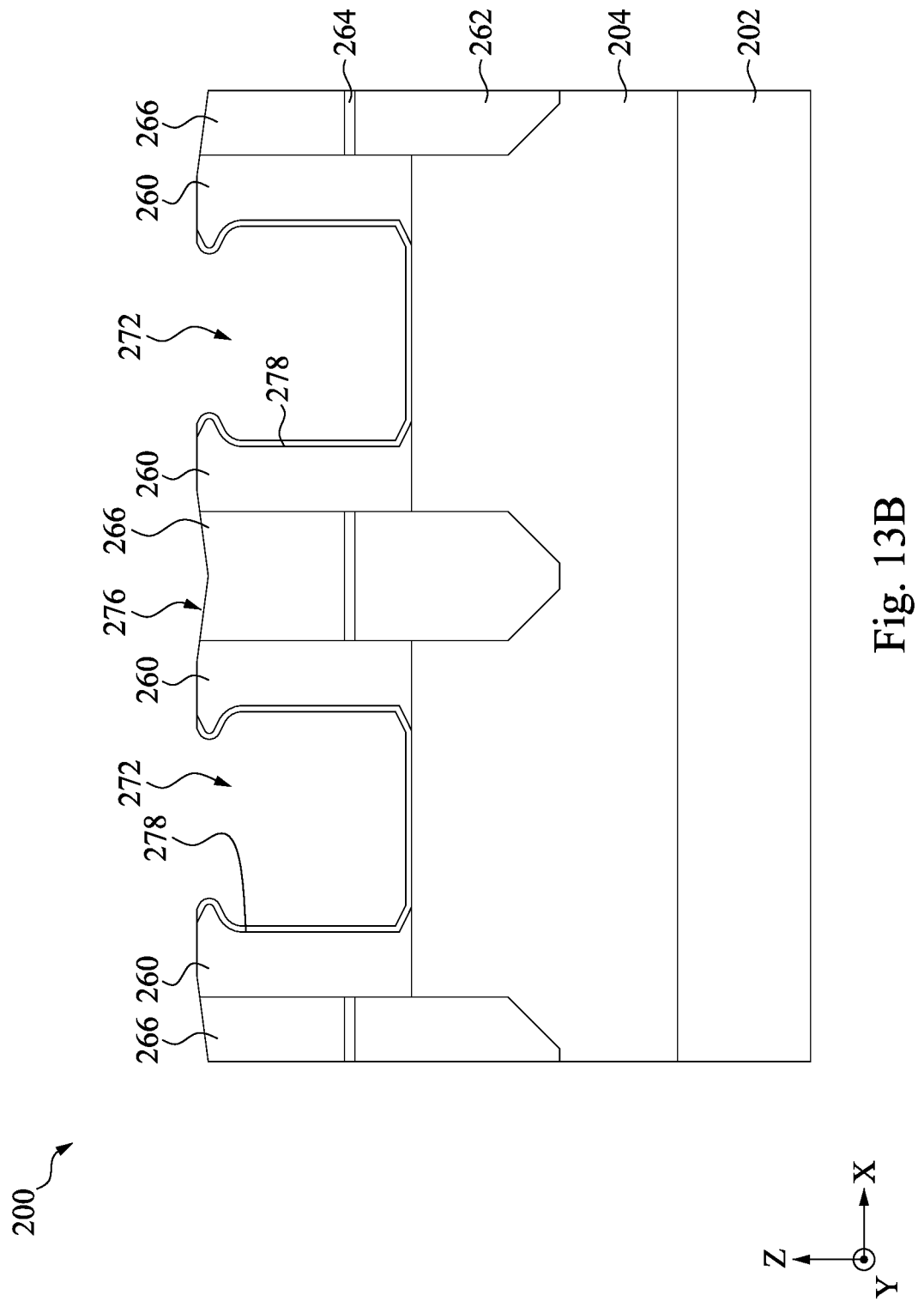

For the radical etching of operation 112 using fluorine (F) and hydrogen (H) radicals as an etchant, a ratio of the number of fluorine atoms to the number of hydrogen atoms (F/H) in the etch processing region 310b (FIG. 11) controls the amount of silane generated as a byproduct. Abundant hydrogen (H) when contacting water vapors in the process chamber will bond with silicon (Si) on the substrate, which forms silane. By adjusting the amount of the hydrogen-containing second precursor gas 374 into the etch processing region 310b, F/H ratio can be fine-tuned. The inventors of the present disclosure have observed a F/H threshold between about 90:1000 to about 96:1000, such as a threshold of about 93:1000 in a specific example, such that when an F/H ratio is larger than the F/H threshold there would not be enough H for silane to generate. Accordingly, the resulting device in FIGS. 12A and 12B is free of silane. On the contrary, when an F/H ratio is less than the threshold, such as less than about 93:1000 in a specific example, silane starts to appear as a byproduct due to the abundant H. Silane is generally regarded as a source of contamination during etching process. However, by carefully controlling the F/H ratio in the etch processing region 310b to be slightly lower than the F/H threshold, such as about 88:1000, properly controlled amount of silane will be formed as a thin capping film 278 covering sidewalls and bottom surface of the gate trench 272, which may serve as a protecting layer to protect the semiconductor device 200 before subsequent operations, such as shown in FIGS. 13A and 13B. FIG. 13A shows a cross-sectional view of the semiconductor device 200 in the Y-Z plane, while FIG. 13B shows a cross-sectional view of the semiconductor device 200 in the X-Z plane.

Figure 14A:
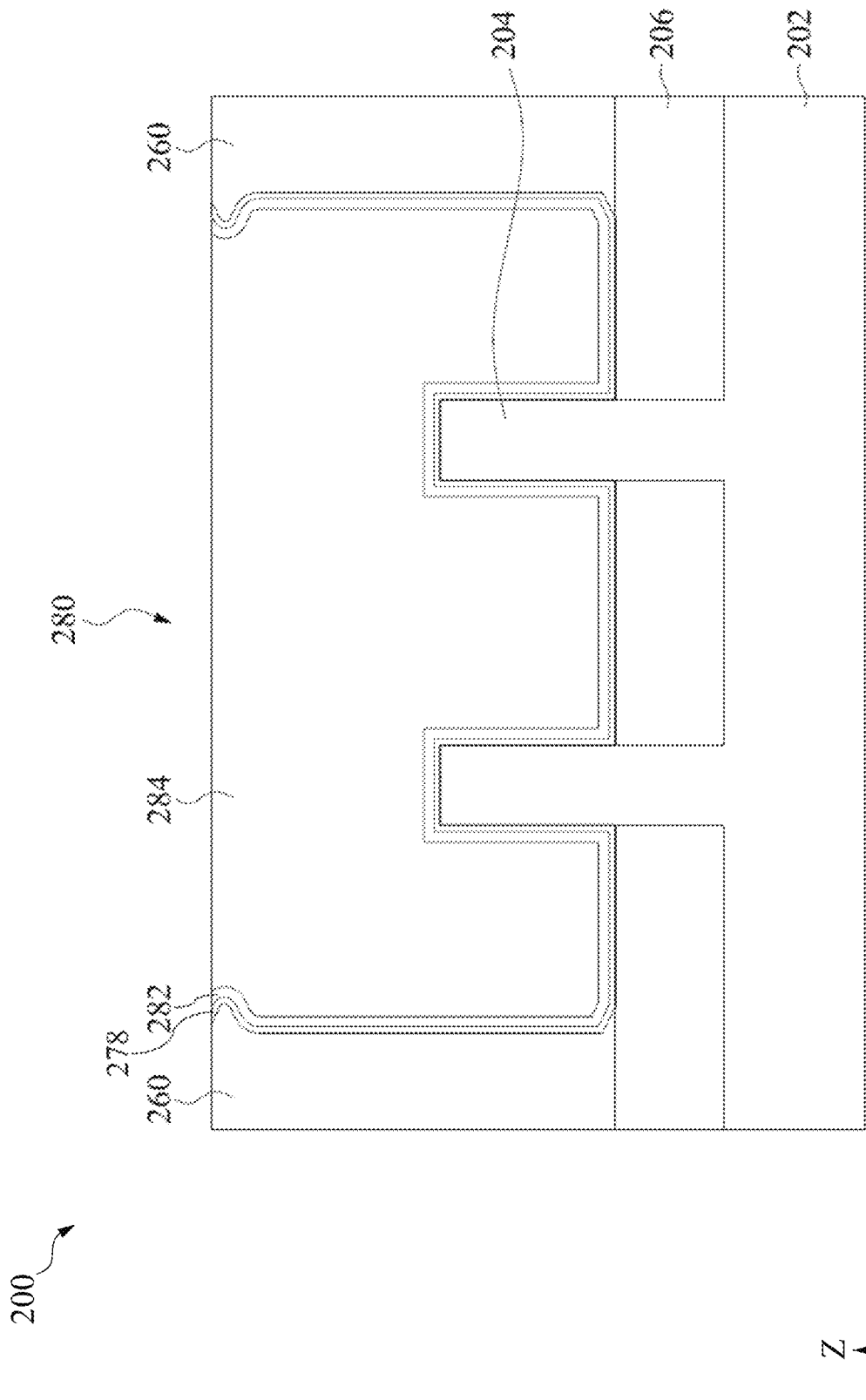
Figure 14B:
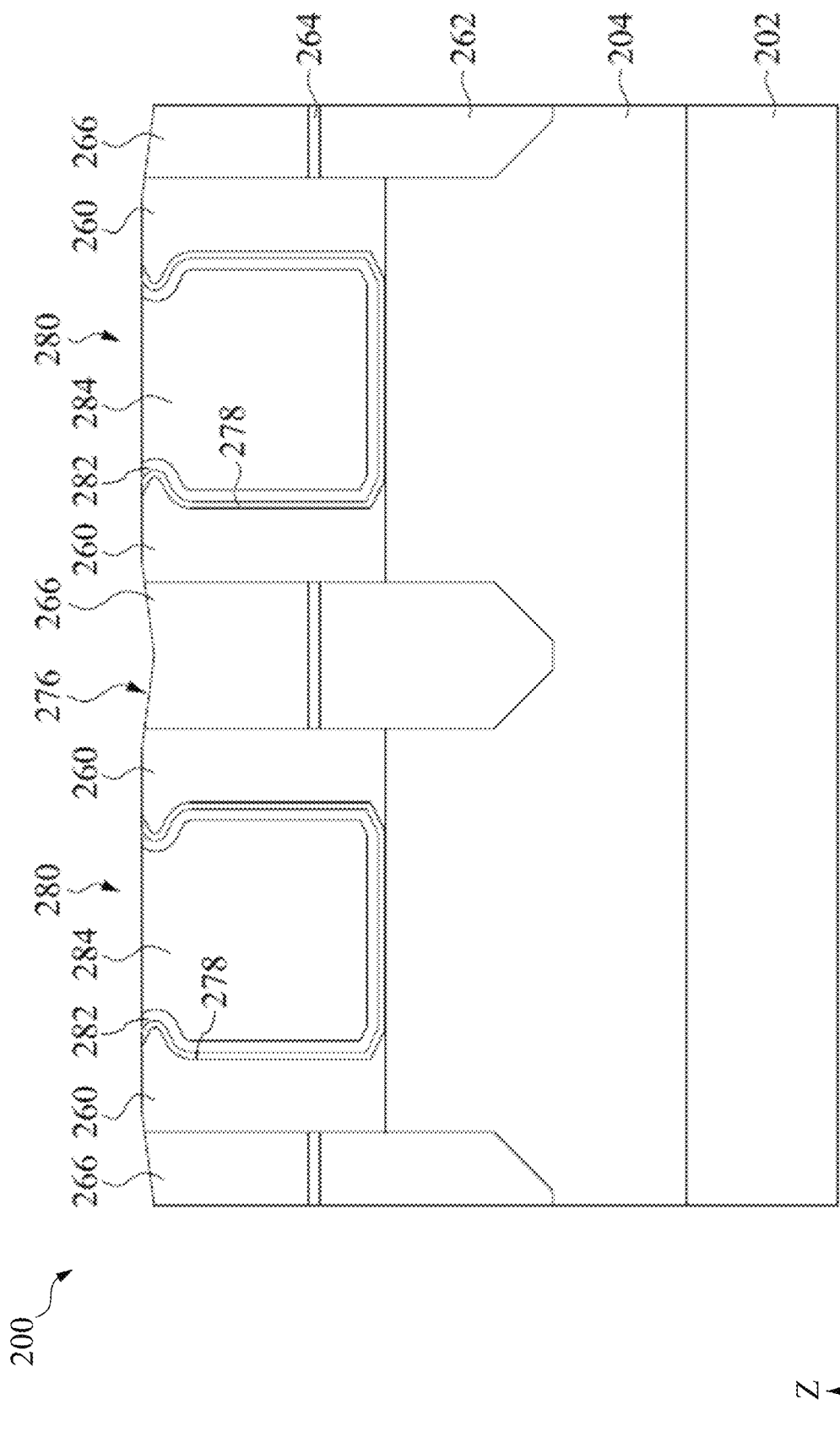

At operation 114, the method 100 (FIG. 1) deposits high-k metal gate stacks 280 in the gate trench 272, such as shown in FIGS. 14A and 14B. FIG. 14A shows a cross-sectional view of the semiconductor device 200 in the Y-Z plane, while FIG. 14B shows a cross-sectional view of the semiconductor device 200 in the X-Z plane. Operation 114 may optionally perform a wet cleaning process beforehand to remove the silane capping film 278 from sidewalls and the bottom surface of the gate trench 272, if the capping film 278 is formed in previous operations. The high-k metal gate stacks 280 include the high-k dielectric layer 282 and the conductive layer 284. The high-k metal gate stacks 280 may further include an interfacial layer (e.g., silicon dioxide or silicon oxynitride) (not shown) between the high-k dielectric layer 282 and the fins 204. The interfacial layer may be formed using chemical oxidation, thermal oxidation, ALD, CVD, and/or other suitable methods.

The high-k dielectric layer 282 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 282 may be deposited using CVD, ALD and/or other suitable methods.

The conductive layer 284 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials. The conductive layer 284 may be deposited using methods such as CVD, PVD, plating, and/or other suitable processes.

Figure 15:
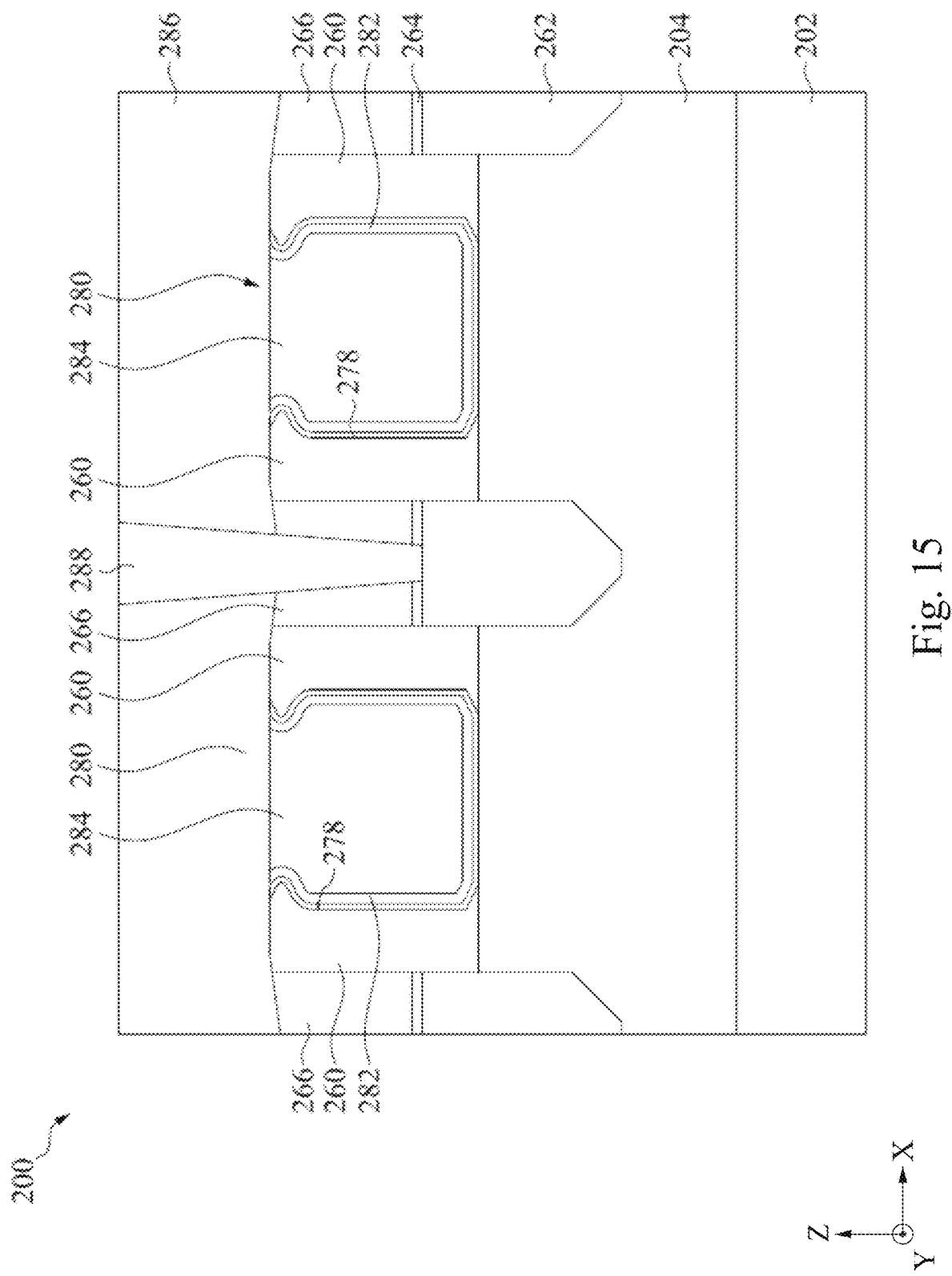

At operation 116, the method 100 (FIG. 1) performs further steps to complete the fabrication of the semiconductor device 200. For example, the method 100 may form metal interconnects connecting various transistors to form a complete IC, such as S/D contacts 288, as shown in FIG. 15, which is a cross-sectional view of the semiconductor device 200 in the X-Z plane. Operation 116 may include depositing a dielectric layer 286 over the semiconductor device 200, etching a contact hole (not shown) exposing the S/D features 262, and depositing one or more conductive materials into the contact hole to form S/D contacts 288. The recessed top surface of the ILD layer 266 may facilitate the landing of the S/D contacts 288.

Although not intended to be limiting, one or more embodiments of the present disclosure provide many benefits to a semiconductor device and the formation thereof. For example, embodiments of the present disclosure provide a gate formation technique that maintains a substantially straight sidewall profile of the gate spacer and consequently substantially straight sidewall profile of the gate stack. The gate formation technique includes radical etching free of ion bombardment. The uniformity of gate structure performance is therefore enhanced. Furthermore, radical etching in gate formation can be easily integrated into existing semiconductor fabrication processes.

In one exemplary aspect, the present disclosure is directed to a method. The method includes providing a structure having a substrate and a fin protruding from the substrate; forming a dummy gate stack over the fin; forming a gate spacer on sidewalls of the dummy gate stack; removing the dummy gate stack using a radical etch process, resulting in a gate trench; and forming a metal gate stack in the gate trench. In some embodiments, the radical etch process is isotropic. In some embodiments, the radical etch process includes exciting a first etching precursor into a plasma; and separating radicals from the plasma prior to having the radicals contact the dummy gate stack. In some embodiments, the method further includes after the separating of the radicals from the plasma, combining the radicals with a second etching precursor. In some embodiments, the first etching precursor is free of oxygen and chlorine. In some embodiments, the radical etch process includes applying radicals containing fluorine and hydrogen. In some embodiments, the radical etch process results in a capping film covering the gate trench. In some embodiments, the capping film includes silane. In some embodiments, the radical etch process includes applying etching precursors with a ratio of number of fluorine atoms to number of hydrogen atoms less than about 93:1000. In some embodiments, the removing of the dummy gate stack is free of applying a biased electric field towards the structure.

In another exemplary aspect, the present disclosure is directed to a method. The method includes receiving a structure in an etch processing region of a process chamber, the structure including a dummy gate stack over a substrate and a gate spacer on sidewalls of the dummy gate stack; generating plasma with a precursor gas in a plasma region of the process chamber, the plasma including radicals and charged ions; flowing the radicals into the etch processing region while substantially excluding the charged ions from entry into the etch processing region; etching the dummy gate stack with the radicals, resulting in a gate trench; and forming a metal gate stack in the gate trench. In some embodiments, the method further includes receiving an unexcited gas in the etch processing region to mix with the radicals. In some embodiments, the radicals and the unexcited gas both include hydrogen. In some embodiments, during the etching of the dummy gate stack, the radicals and the unexcited gas include fluorine and hydrogen. In some embodiments, a ratio of number of fluorine atoms to number of hydrogen atoms is larger than about 93:1000. In some embodiments, a ratio of number of fluorine atoms to number of hydrogen atoms is smaller than 93:1000, such that the etching of the dummy gate stack results in a capping film over sidewalls of the gate trench. In some embodiments, the method further includes performing a wet cleaning process to remove the capping film prior to the forming of the metal gate stack.

In yet another exemplary aspect, the present disclosure is directed to a semiconductor device. The semiconductor device includes a substrate; a fin protruding from the substrate, the fin extending lengthwise in a first direction; a gate stack engaging the fin, the gate stack extending lengthwise in a second direction perpendicular to the first direction; and a gate spacer on sidewalls of the gate stack, the gate spacer including an inner sidewall directly interfacing with the sidewalls of the gate stack and an outer sidewall opposing the inner sidewall, in a cross-sectional view along the first direction the inner sidewall having a first height and a bowed structure extending towards the gate stack for a first lateral distance measured from a middle point of the inner sidewall along the first direction, wherein in the cross-sectional view along the first direction the outer sidewall has a second height lower than the first height of the inner sidewall. In some embodiments, the first lateral distance is less than about 8% of the first height. In some embodiments, in the cross-sectional view along the first direction the inner sidewall has a footing structure laterally extending towards the gate stack for a second lateral distance measured from the middle point of the inner sidewall along the first direction, wherein the second lateral distance is less than about 8% of the first height.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a fin over the substrate, the fin including two source/drain regions and a channel region;
   a gate structure engaging the channel region of the fin;
   source/drain features on the source/drain regions of the fin;
   a gate spacer between the gate structure and the source/drain features, the gate spacer having an inner sidewall interfacing the gate structure and an outer sidewall interfacing the source/drain features, the outer sidewall being lower than the inner sidewall; and
   a dielectric layer over the source/drain features, wherein a top surface of the dielectric layer has a recess that is lower than the outer sidewall.

2. The semiconductor device of claim 1, wherein a top portion of the inner sidewall has a bowed structure extending towards the gate structure.

3. The semiconductor device of claim 1, wherein a bottom portion of the inner sidewall has a footing structure extends towards the gate structure.

4. The semiconductor device of claim 1, wherein the fin extends lengthwise in a first direction, and wherein in a cross-sectional view along the first direction the inner sidewall has, from top to bottom, a first bowed structure extending laterally towards the gate structure, a first straight sidewall portion, and a first footing structure extending laterally towards the gate structure.

5. The semiconductor device of claim 4, wherein the gate structure extends lengthwise in a second direction perpendicular to the first direction, and wherein in a cross-sectional view along the second direction, the inner sidewall has, from top to bottom, a second bowed structure extending laterally towards the gate structure, a second straight sidewall portion, and a second footing structure extending laterally towards the gate structure.

6. A semiconductor device, comprising:
   a substrate;
   a fin protruding from the substrate, the fin extending lengthwise along a first direction and including two source/drain regions and a channel region;
   a gate stack over the channel region of the fin, the gate stack extending lengthwise along a second direction perpendicular to the first direction;
   source/drain features on the source/drain regions of the fin;
   a gate spacer on sidewall of the gate stack and between the gate structure and the source/drain features, the gate spacer including an inner sidewall interfacing the gate stack and an outer sidewall interfacing the source/drain features, the outer sidewall being lower than the inner sidewall, in a cross-sectional view along the first direction the inner sidewall has, from top to bottom, a first bowed structure extending laterally towards the gate stack, a first straight sidewall portion, and a first footing structure extending laterally towards the gate stack; and
   a dielectric layer over the source/drain features, wherein a top surface of the dielectric layer has a recess that is lower than the outer sidewall.

7. The semiconductor device of claim 6, wherein a lateral distance from a tip of the first bowed structure to the first straight sidewall portion measured along the first direction is less than about 8% of a height of the gate spacer.

8. The semiconductor device of claim 6, wherein a lateral distance from a tip of the first footing structure to the first straight sidewall portion measured along the first direction is less than about 8% of a height of the gate spacer.

9. The semiconductor device of claim 6, wherein the gate spacer includes an outer sidewall opposing the inner sidewall, and the outer sidewall is lower than the inner sidewall.

10. The semiconductor device of claim 6, wherein the first straight sidewall portion is perpendicular to a top surface of the fin.

11. The semiconductor device of claim 6, wherein in a cross-sectional view along the second direction, the inner sidewall has, from top to bottom, a second bowed structure extending laterally towards the gate stack, a second straight sidewall portion, and a second footing structure extending laterally towards the gate stack.

12. The semiconductor device of claim 11, wherein a lateral distance from a tip of the second bowed structure to the second straight sidewall portion measured along the second direction is less than about 8% of a height of the gate spacer, and a lateral distance from a tip of the second footing structure to the second straight sidewall portion measured along the second direction is less than about 8% of the height of the gate spacer.

13. A semiconductor device, comprising:
   a substrate;
   an isolation structure on the substrate;
   a fin protruding from the substrate and through the isolation structure, the fin extending lengthwise along a first direction;
   a gate stack engaging the fin, the gate stack extending lengthwise along a second direction different from the first direction;
   a gate spacer on sidewalls of the gate stack, the gate spacer including an inner sidewall facing the gate stack and an outer sidewall opposing the inner sidewall, in a cross-sectional view along the first direction the inner sidewall having a first height measured from a top surface of the fin and a footing structure in a bottom portion of the inner sidewall, the footing structure extending towards the gate stack for a first lateral distance measured from a middle point of the inner sidewall along the first direction, the first lateral distance being less than about 8% of the first height;
   source/drain features on the fin; and
   a dielectric layer on the source/drain features, wherein a top surface of the dielectric layer is declined towards its center.

14. The semiconductor device of claim 13, wherein in the cross-sectional view along the first direction the outer sidewall has a second height measured from the top surface of the fin, and the second height is smaller than the first height.

15. The semiconductor device of claim 13, wherein in a cross-sectional view along the second direction the inner sidewall has a third height measured from a top surface of the isolation structure and the outer sidewall has a fourth height measured from the top surface of the isolation structure, the third height substantially equals the fourth height.

16. The semiconductor device of claim 13, wherein in a cross-sectional view along the second direction the inner sidewall has a third height measured form a top surface of the isolation structure, and in the cross-sectional view along the second direction the top portion of the inner sidewall has another bowed structure extending towards the gate stack for a third lateral distance measured from a middle point of the inner sidewall along the second direction.

17. The semiconductor device of claim 16, wherein the third lateral distance is less than about 8% of the third height.

18. The semiconductor device of claim 13, wherein in the cross-sectional view along the first direction a top portion of the inner sidewall has a bowed structure, and the bowed structure extends towards the gate stack for a second lateral distance measured from the middle point of the inner sidewall along the first direction.

19. The semiconductor device of claim 18, wherein the second lateral distance is less than about 8% of the first height.

20. The semiconductor device of claim 18, wherein in the cross-sectional view along the first direction a middle portion of the inner sidewall is a straight sidewall extending from the bowed structure to the footing structure, and the straight sidewall is perpendicular to the top surface of the fin.

* * * * *